(12) United States Patent
Ishibashi et al.

(10) Patent No.: US 8,304,734 B2
(45) Date of Patent: Nov. 6, 2012

(54) INFRARED SENSOR

(75) Inventors: Kazutoshi Ishibashi, Fuji (JP);
Masayuki Sato, Shizuoka (JP); Edson Gomes Camargo, Fuji (JP); Yoshinori Yanagita, Yokohama (JP); Hidetoshi Endo, Fuji (JP)

(73) Assignee: Asahi Kasei EMD Corporation, Tokyo (JP)

(*) Notice: Subject to any disclaimer, the term of this patent is extended or adjusted under 35 U.S.C. 154(b) by 1048 days.

(21) Appl. No.: 12/295,711

(22) PCT Filed: Apr. 23, 2007

(86) PCT No.: PCT/JP2007/058761
§ 371 (c)(1),
(2), (4) Date: Oct. 1, 2008

(87) PCT Pub. No.: WO2007/125873
PCT Pub. Date: Nov. 8, 2007

(65) Prior Publication Data
US 2009/0134333 A1     May 28, 2009

(30) Foreign Application Priority Data

Apr. 24, 2006  (JP) ................. 2006-119149
Jun. 22, 2006  (JP) ................. 2006-172674
Dec. 4, 2006   (JP) ................. 2006-327098

(51) Int. Cl.
*G01J 5/02*    (2006.01)
*G01K 15/00*   (2006.01)

(52) U.S. Cl. .................... 250/352; 702/99

(58) Field of Classification Search ........ 250/352, 250/238, 214 C; 702/99; 374/121
See application file for complete search history.

(56) References Cited

U.S. PATENT DOCUMENTS

| | | | |
|---|---|---|---|
| 5,917,183 A | 6/1999 | Sperling | 250/238 |
| 6,426,495 B1 | 7/2002 | Hayami et al. | 250/214 R |
| 6,603,110 B2 | 8/2003 | Hayami et al. | 250/214 R |
| 7,036,978 B2 | 5/2006 | Tabata et al. | 374/121 |
| 2004/0228386 A1 | 11/2004 | Tabata et al. | 374/121 |
| 2004/0233968 A1 | 11/2004 | Tabata et al. | 374/121 |
| 2007/0090337 A1 | 4/2007 | Ueno et al. | 257/13 |

FOREIGN PATENT DOCUMENTS

| | | |
|---|---|---|
| EP | 1 049 048 A1 | 11/2000 |
| JP | 63-51469 U | 4/1988 |
| JP | 5-191161 | 7/1993 |
| JP | 05-234120 | 9/1993 |
| JP | 6-9157 | 2/1994 |
| JP | 06-201477 | 7/1994 |
| JP | 09-229763 | 9/1997 |

(Continued)

*Primary Examiner* — David Porta
*Assistant Examiner* — Faye Boosalis
(74) *Attorney, Agent, or Firm* — Morgan, Lewis & Bockius LLP

(57) ABSTRACT

An infrared sensor capable of more highly accurately correcting an electrical signal converted by a light receiving unit is provided. An infrared sensor (100) converts energy of infrared rays radiated from an object (for example, human body) to an electrical signal and outputs the electrical signal, the infrared sensor comprising: a light receiving unit (10) that includes a quantum type infrared detection element (11) and that converts the energy of the infrared rays to an electrical signal; and a correction unit (20) that corrects the output signal from the light receiving unit (10), wherein the light receiving unit (10) and the correction unit (20) are formed of the identical material on the identical substrate (1) and have the identical configuration so that the infrared rays enters in an identical manner.

27 Claims, 19 Drawing Sheets

FOREIGN PATENT DOCUMENTS

| | | |
|---|---|---|
| JP | 10-508984 | 9/1998 |
| JP | 11-211563 | 8/1999 |
| JP | 2000-341055 | 12/2000 |
| JP | 2001-068943 | 3/2001 |
| JP | 2002-092882 | 3/2002 |
| JP | 2003-130727 | 5/2003 |
| JP | 2003-198268 | 7/2003 |
| JP | 2004-236259 | 8/2004 |
| JP | 3690387 B2 | 6/2005 |
| WO | WO 2005/027228 | 3/2005 |

F I G. 2 0
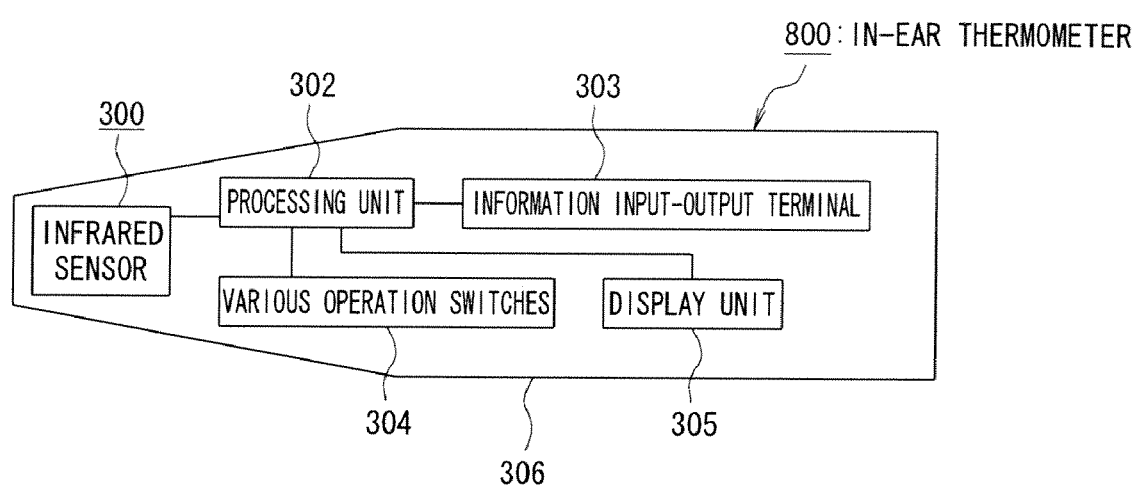

INFRARED SENSOR

TECHNICAL FIELD

The present invention relates to an infrared sensor, and more specifically, to a technique adapted to accurately measure the temperature of an object.

BACKGROUND ART

Examples of generally known infrared sensors for detecting a long wavelength infrared ray around 10 μm having very small energy, such as radiation from human body, include a pyroelectric sensor, a thermoelectric sensor, and a bolometer sensor that are thermopile sensors (for example, refer to JP06-201477A (hereinafter referred to as Patent Document 1)). Although the pyroelectric sensor is configured to generate an output voltage signal based on the temperature change of a pyroelectric material arranged on an absorber that absorbs infrared radiation, an output signal can be obtained only from a moving object or when the incidence of light is changed. On the other hand, the thermopile and the bolometer can output electrical signals proportional to a certain amount of infrared radiation, being able to be used in radiation thermometer or the like, and also for the human body detection.

One example of the radiation thermometer includes an in-ear thermometer. In the in-ear thermometer, a thermopile for detecting the infrared ray emitted from near the eardrum and a waveguide for guiding the infrared ray to the thermopile are arranged in the probe that is inserted into external auditory canal upon measurement. The output from the thermopile is converted to body temperature by computing means for display (for example, refer to JP3690387B).

Examples of inventions known to the public related to the infrared sensor other than the ones described above include inventions in JP05-191161A, JP2000-341055A, JP05-234120A and WO2005/027228A1 (hereinafter referred to as Patent Documents 2, 3, 4 and 5) described below. A configuration of one example of a method of extracting the electromotive voltage of photodiodes is described in Patent Document 2 where plural photodiodes are connected in series in multistage. According to such a configuration, an output that is a multiple of the number of photodiodes greater than the output of the electromotive voltage of each photodiode can be obtained, and thus, a large voltage can be obtained as a whole even if the electromotive voltage per photodiode is small. Patent Document 3 describes, as shown in its FIG. 5, an infrared sensor comprising a photodiode, an operational amplifier circuit, and a resistive element. The infrared sensor amplifies the signal of the current (electromotive current) generated in the photodiode and extracts the resultant as an output.

Furthermore, Patent Document 4 describes a light receiving element circuit comprising a photodiode applied with a reverse bias voltage and a differential amplifier that amplifies a photocurrent of the photodiode, wherein a photodiode biased with a reverse voltage is connected to one end of the photodiode. According to such a configuration, the output fluctuation of the photodiode can be reduced. Patent Document 5 describes an infrared sensor having a quantum infrared detection element in a light receiving unit, and InAsxSb1-x ($0 \leq x \leq 1$) is used on the light receiving surface of the infrared detection element.

DISCLOSURE OF THE INVENTION

By the way, in a thermal sensor such as the one shown in Patent Document 1, the detection element such as a pyroelectric material, a thermopile, or a bolometer absorbs an infrared ray emitted from an object, and the temperature of the element itself rises. The temperature of the object is measured by detecting the characteristic change of the temperature rise. Therefore, the detection element in general is constituted by a material with a resistance with a high temperature dependence. However, it takes a long time from the start of the absorption of the infrared ray to the stabilization of the temperature of the detection element. Thus, there is a problem that the temperature detection rate (i.e., responsivity) of the thermal sensor is low, and the detection accuracy is insufficient.

Additionally, a heat sink (heat shielding member) is provided around the resistive element (except the light receiving surface) of the thermal sensor to prevent heat absorption from anything other than the object or to prevent heat release. Furthermore, in some cases, a gas with low thermal conductivity such as nitrogen ($N_2$) is enclosed in the package for housing the thermal sensor to maintain the sensitivity of the detection element high. Thus, there is a problem that the miniaturization of the sensor and the reduction in thickness are difficult because the thermal sensor requires a large package that can enclose the heat sink, the $N_2$ gas, or the like.

The present invention has been made in view of the foregoing problems, and an object thereof is to provide an infrared sensor that can be miniaturized and reduced in thickness and that can compensate with high accuracy an electrical signal obtained by photoelectric conversion. An infrared sensor according to a first invention that converts energy of an infrared ray radiated from an object to an electrical signal and that outputs the electrical signal, a light receiving unit that includes a quantum infrared detection element that converts the energy of the infrared ray to an electrical signal; and a correction unit that corrects the first output signal from the light receiving unit, wherein the light receiving unit and the correction unit are formed of an identical material on an identical substrate and have an identical configuration so that the infrared ray enters in an identical manner. "Quantum infrared detection element" herein refers to an element that changes the electrical property in accordance with the absorption of light quantum (photon) of the infrared ray, i.e., an element that performs the photoelectric conversion. An example of such a quantum infrared detection element includes a photodiode having a pn junction or a pin junction.

The infrared sensor, according to a second invention in the infrared sensor, of the first invention is characterized in that the light receiving unit comprises a plurality of the infrared detection elements connected in series in a plurality of stages.

The infrared sensor, according to a third invention in the infrared sensor, of the first invention is characterized in that the correction unit comprises a temperature characteristic compensation element that compensates the temperature characteristic of the first output signal from the light receiving unit.

The infrared sensor, according to a fourth invention in the Infrared sensor, of the first invention is characterized in that the correction unit comprises a temperature measuring element that measures a temperature of the light receiving unit.

The infrared sensor, according to a fifth invention in the infrared sensor, of the first invention is characterized in that the correction unit comprises: a temperature characteristic compensation element that compensates the temperature characteristic of the first output signal from the light receiving unit; and a temperature measuring element that measures the temperature of the light receiving unit.

The infrared sensor, according to a sixth invention in the infrared sensor, of the third invention is characterized in that the correction unit comprises a plurality of the temperature characteristic compensation elements connected in series in a plurality of stages, and a second output signal for temperature characteristic compensation is extracted from an arbitrary connection point of the plurality of temperature characteristic compensation elements connected in series.

The infrared sensor, according to a seventh invention in the infrared sensor, of the fourth invention is characterized in that the correction unit comprises a plurality of the temperature measuring elements connected in series in a plurality of stages; and a temperature signal, in which the temperature of the light receiving unit has been measured, is extracted from an arbitrary connection point of the plurality of temperature measuring elements connected in series.

The infrared sensor, according to an eighth invention in the infrared sensor, of the third invention is characterized in that the infrared detection element is made of a first photodiode; the temperature characteristic compensation element is made of a second photodiode; and the first photodiode and the second photodiode are formed of an identical material on an identical substrate and have an identical configuration so that the infrared ray enters in an identical manner.

The infrared sensor, according to a ninth invention in the infrared sensor, of the fourth invention is characterized in that the infrared detection element is made of a first photodiode; the temperature measuring element is made of a third photodiode; and the first photodiode and the third photodiode are formed of an identical material on an identical substrate and have an identical configuration so that the infrared ray enters in an identical manner.

The infrared sensor, according to a tenth invention in the infrared sensor, of the fourth invention is characterized by comprising a correction computing unit that corrects the first output signal from the light receiving unit based on a temperature signal measured by the temperature measuring element.

The infrared sensor, according to an eleventh invention in the infrared sensor, of the third invention or the sixth invention is characterized by comprising: an operational amplifier circuit that amplifies the first output signal from the light receiving unit; a resistive element connected between an inverting input terminal and an output terminal of the operational amplifier circuit; and a reference voltage generating circuit that generates a reference voltage, wherein a first terminal of the light receiving unit is connected to an non-inverting input terminal of the operational amplifier circuit, a first terminal of the temperature characteristic compensation element is connected to the inverting input terminal of the operational amplifier circuit, and a second terminal of the light receiving unit and a second terminal of the temperature characteristic compensation element are commonly connected to the reference voltage generating circuit.

The infrared sensor, according to a twelfth invention in the infrared sensor, of the eleventh invention is characterized in that the infrared detection element included in the light receiving unit is made of the first photodiode; the temperature characteristic compensation element is made of the second photodiode; the first photodiode and the second photodiode are formed of an identical material on an identical substrate and have an identical configuration so that the infrared ray enters in an identical manner; the first terminal of the light receiving unit is the anode terminal of the first photodiode; the second terminal of the light receiving unit is the cathode terminal of the first photodiode; the first terminal of the temperature characteristic compensation element is the cathode terminal of the second photodiode, and the second terminal of the temperature characteristic compensation element is the anode terminal of the second photodiode.

The infrared sensor, according to a thirteenth invention in the infrared sensor, of the third invention or the sixth invention is characterized by comprising: a current source that supplies a current to the temperature characteristic compensation element; a comparator circuit that compares the first output signal from the light receiving unit with the second output signal from the temperature characteristic compensation element; and a reference voltage generating circuit that generates a reference voltage, wherein a first terminal of the light receiving unit is connected to a first input terminal of the comparator circuit, a first terminal of the temperature characteristic compensation element and a first terminal of the current source are connected to a second input terminal of the comparator circuit, a second terminal of the light receiving unit and a second terminal of the temperature characteristic compensation element, and a second terminal of the current source are commonly connected to the reference voltage generating circuit.

The infrared sensor, according to a fourteenth invention in the infrared sensor, of the third invention or the sixth invention is characterized by comprising: a voltage follower circuit that buffers the first output signal from the light receiving unit; an operational amplifier circuit in which a first terminal of the temperature characteristic compensation element is connected to an inverting input terminal; a resistive element connected between the inverting input terminal and an output terminal of the operational amplifier circuit; and a reference voltage generating circuit that is connected to an non-inverting input terminal of the operational amplifier circuit and that generates a reference voltage, wherein an output terminal of the voltage follower circuit and a second terminal of the temperature characteristic compensation element are connected.

The infrared sensor, according to a fifteenth Invention in the infrared sensor, of the tenth invention is characterized by comprising: a measurement unit that supplies a current to the temperature measuring element; and a reference voltage generating circuit that generates a reference voltage, wherein a first terminal of the light receiving unit is connected to the correction computing unit, a first terminal of the temperature measuring element is connected to the correction computing unit through the measurement unit, and a second terminal of the light receiving unit and a second terminal of the temperature measuring element are commonly connected to the reference voltage generating circuit.

The infrared sensor, according to a sixteenth invention in the infrared sensor, of the fifteenth invention is characterized by comprising at least a part of the light receiving unit and at least a part of the temperature measuring element sharing an element, and a control unit, which causes the light receiving unit and the temperature measuring element to alternately operate thereby causing the first output signal from the light receiving unit and the temperature signal from the temperature measuring element to alternately enter the correction computing unit, is included.

The infrared sensor, according to a seventeenth invention in the infrared sensor, of the third invention or the sixth invention is characterized in that the light receiving unit comprises: a first light receiving unit; a second light receiving unit that outputs a second output signal having a polarity opposite to a first output signal outputted from the first light receiving unit; a first operational amplifier circuit that amplifies the first output signal from the first light receiving unit; a second operational amplifier circuit that amplifies the second output signal from the second light receiving unit; a third operational amplifier circuit that amplifies a signal outputted from the first operational amplifier circuit and a signal outputted from the second operational amplifier circuit; a first resistive element connected between an inverting input terminal and an output terminal of the first operational amplifier circuit; a second resistive element connected between an inverting input terminal and an output terminal of the second operational amplifier circuit; and a reference voltage generating circuit that generates a reference voltage, wherein: a first terminal of the first light receiving unit is connected to an non-inverting input terminal of the first operational amplifier circuit, a first terminal of the temperature characteristic compensation element is connected to the inverting input terminal of the first operational amplifier circuit, a second terminal of the first light receiving unit is connected to the reference voltage generating circuit; and a first terminal of the second light receiving unit is connected to a non-inverting input terminal of the second operational amplifier circuit, a second terminal of the temperature characteristic compensation element is connected to the inverting input terminal of the second operational amplifier circuit, and a second terminal of the second light receiving unit is connected to the reference voltage generating circuit.

The infrared sensor, according to an eighteenth invention in the infrared sensor, of the seventeenth invention is characterized in that each of a first infrared detection element included in the first light receiving unit and a second infrared detection element included in the second light receiving unit is made of a first photodiode; the temperature characteristic compensation element is made of a second photodiode; the first photodiode and the second photodiode are formed of an identical material on an identical substrate and have an identical configuration so that the infrared ray enters in an identical manner; the anode terminal of the first photodiode that constitutes the first infrared detection element is connected to the non-inverting input terminal of the first operational amplifier circuit, while the cathode terminal of the first photodiode is connected to the reference voltage generating circuit; the cathode terminal of the first photodiode that constitutes the second infrared detection element is connected to the non-inverting input terminal of the second operational amplifier circuit, while the anode terminal of the first photodiode is connected to the reference voltage generating circuit; and the cathode terminal of the second photodiode that constitutes the temperature characteristic compensation element is connected to the inverting input terminal of the first operational amplifier circuit, while the anode terminal of the second photodiode is connected to the inverting input terminal of the second operational amplifier circuit.

The infrared sensor, according to an nineteenth invention in the infrared sensor, of the eighteenth invention is characterized in that the correction unit comprises a plurality of the temperature characteristic compensation elements; the cathode terminal of the second photodiode that constitutes a first temperature characteristic compensation element is connected to the inverting input terminal of the first operational amplifier circuit, while the anode terminal of the second photodiode is connected to the inverting input terminal of the second operational amplifier circuit; and the cathode terminal of the second photodiode that constitutes a second temperature characteristic compensation element is connected to the inverting input terminal of the second operational amplifier circuit, while the anode terminal of the second photodiode is connected to the inverting input terminal of the first operational amplifier circuit.

The infrared sensor, according to a twentieth invention 20 in the infrared sensor, of the eighth invention or the ninth invention is characterized in that the first photodiode is made of a compound including at least one of In and Sb.

The infrared sensor, according to a twenty-first invention in the infrared sensor, of the eighth invention or the ninth invention is characterized in that InAs$_x$Sb1-x (0≦x≦1) is used for the light receiving surface of the first photodiode.

The infrared sensor, according to a twenty-second invention in the infrared sensor, of the eighth invention or the ninth invention is characterized in that the first photodiode comprises: a substrate; an n-type InSb layer formed on the substrate; a non-doped InSb layer formed on the n-type InSb layer; an AlInSb layer formed on the non-doped InSb layer; and a p-type InSb layer formed on the AlInSb layer.

The infrared sensor, according to a twenty-third invention in the infrared sensor, of the tenth invention is characterized in that the correction computing unit comprises: a storage unit that stores a correlation between output data from the light receiving unit and temperature data from the temperature measuring element, the output data and the temperature data occurring when the temperature of the surrounding atmosphere of the temperature measuring element is set up to a predetermined temperature and then the temperature of the object is changed; a computing unit that determines by computation a relational expression indicative of a relationship between the temperature of the object and the output from the light receiving unit, based on the correlation stored in the storage unit and one temperature data actually measured; and a calculation unit that calculates the temperature of the object by applying the output data actually measured to the determined relational expression.

The infrared sensor, according to a twenty-fourth invention in the infrared sensor, of the tenth invention is characterized in that the correction computing unit comprises: a storage unit that stores output data from the light receiving unit and temperature data from the temperature measuring element, the output data and the temperature data occurring when the temperature of the object is set up to a predetermined temperature and then the temperature of the surrounding atmosphere of the temperature measuring element is changed; a computing unit that determines by computation a relational expression indicative of a relationship between the temperature of the object and the output of the light receiving unit, based on the correlation stored by the storage unit and the temperature data actually measured; and a calculation unit that calculates the temperature of the object by applying the output data actually measured to the determined relational expression.

A thermometer according to a twenty-fifth invention is characterized by comprising the infrared sensor according to any one of the first to the twenty-fourth inventions and by measuring the temperature of an object.

A body thermometer according to a twenty-sixth invention is characterized by comprising the infrared sensor according to any one of the first to the twenty-fourth inventions and by measuring the temperature of human body.

A human detection sensor according to a twenty-seventh invention is characterized by comprising the infrared sensor according to any one of the first to the twenty-fourth inventions and by detecting a human body.

A temperature correction method, according to a twenty-eighth invention, of correcting an output signal from a light receiving unit based on a temperature measured by a temperature measuring element, the temperature correction method characterized by comprising: a first step of measuring first output data from the light receiving unit by setting up a temperature of the surrounding atmosphere of the temperature measuring element to a first constant temperature and then changing a temperature of an object; a second step of measuring second output data from the light receiving unit by setting up the temperature of surrounding atmosphere of the temperature measuring element to a second constant temperature different from the first constant temperature in the first step and then changing the temperature of the object; and a third step of finding a relational expression between the temperature of the object and an output from the light receiving unit, based on the first output data measured in the first step and the second output data measured in the second step.

A temperature correction method, according to a twenty-ninth invention, of correcting an output signal from a light receiving unit based on a temperature measured by a temperature measuring element, the temperature correction method characterized by comprising: a first step of measuring first output data from the light receiving unit by setting up a temperature of an object to a first constant temperature and then changing a temperature of surrounding atmosphere of the temperature measuring element; a second step of measuring second output data from the light receiving unit by setting up the temperature of the object to a second constant temperature different from the first constant temperature in the first step and then changing the temperature of the surrounding atmosphere of the temperature measuring element; and a third step of finding a relational expression between the temperature of the object and an output from the light receiving unit, based on the first output data measured in the first step and the second output data measured in the second step.

The present invention allows miniaturization and reduction in thickness and enables to correct with high accuracy the electrical signal obtained by photoelectric conversion.

BRIEF DESCRIPTION OF THE DRAWINGS

FIG. 20 is a diagram showing a configuration example of an in-ear thermometer 800 according to a seventh embodiment of the present invention;

BEST MODE FOR CARRYING OUT THE INVENTION

The embodiments of the present invention will now be described based on the drawings.

(1) First Embodiment

Figure 1:
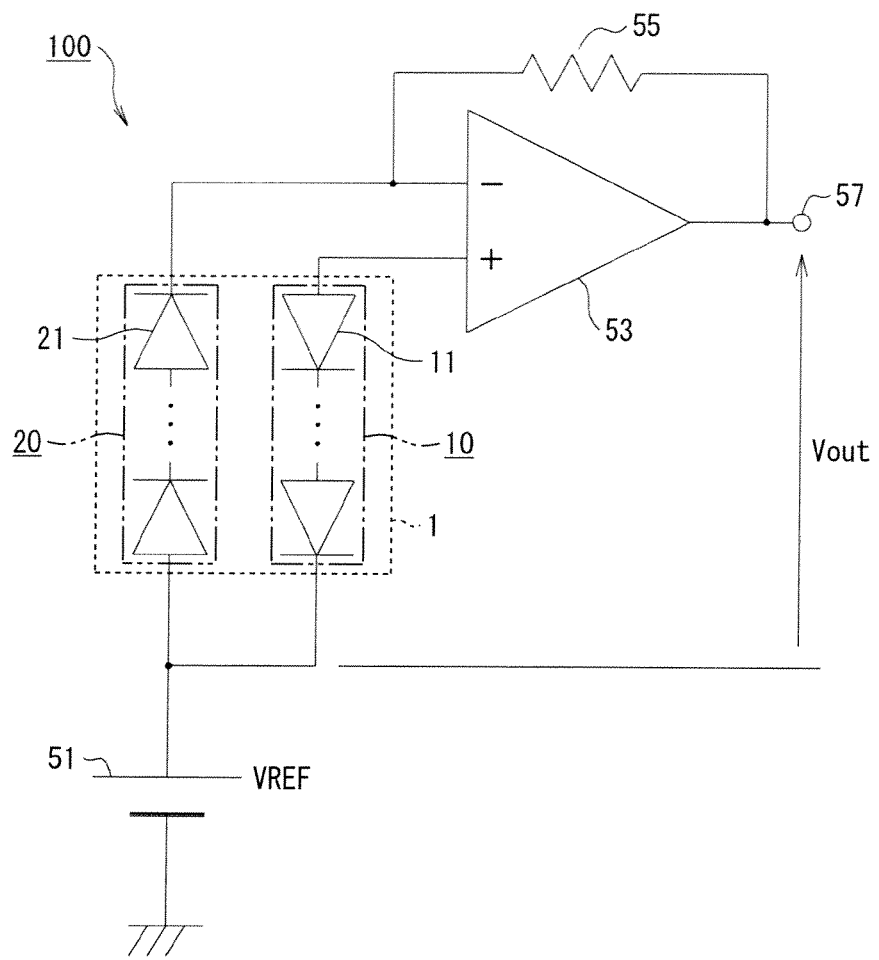
FIG. 1 is a schematic diagram showing a configuration example of an infrared sensor 100 according to a first embodiment of the present invention.

FIG. 1 is a schematic diagram showing a configuration example of an infrared sensor 100 according to a first embodiment of the present invention. As shown in FIG. 1, the infrared sensor 100 comprises a light receiving unit 10 including a quantum infrared detection element 11, a correction unit 20 including a temperature characteristic compensation element 21, a reference voltage generating circuit 51, an operational amplifier circuit 53, a resistive element 55, and an output terminal 57.

The reference voltage generating circuit 51 generates a desired reference voltage to be applied to the infrared detection element 11 and the temperature characteristic compensation element 21. The reference voltage generating circuit 51 generates a desired reference voltage VREF based on, for example, a ground potential (OV). The infrared detection element 11 is an element that detects an Infrared ray. The temperature characteristic compensation element 21 is an element that compensates the temperature characteristic of an output signal (output voltage) of the infrared detection element 11. The light receiving unit 10 and the correction unit 20 are formed on an Identical substrate 1 adjacent to each other so that the influence of the ambient temperature is the same.

"Formed on the identical substrate adjacent to each other" herein means that the light receiving unit 10 and the correction unit 20 are monolithic, or formed on one semiconductor substrate. The substrate 1 on which both of the light receiving unit 10 and the correction unit 20 are formed is, for example, a semi-insulating semiconductor substrate, and one example thereof is a GaAs or Si substrate. In the infrared sensor 100 shown in FIG. 1, the light receiving unit 10 and the correction unit 20 constitute one infrared sensor chip.

The temperature characteristic compensation element 21 has an identical configuration as the infrared detection element 11 and formed of an identical material so as to provide an identical temperature coefficient as the internal resistance of the infrared detection element 11. The light receiving unit 10 is constituted by, for example, the infrared detection elements 11 connected in series in n stages. The correction unit 20 is constituted by, for example, one or m temperature characteristic compensation elements 21 connected in series. The letters "n" and "m" are integers equal to or greater than two.

Specifically, the infrared detection element 11 is constituted by a first photodiode, and the temperature characteristic compensation element 21 is constituted by a second photodiode. The pn structures of the infrared detection element 11 and the temperature characteristic compensation element 21 are the same, and the material (i.e., kind or composition of compound semiconductor material and the amount of doped impurities included therein) of the layers constituting the pn structures and the film thicknesses is also the same. However, the areas (i.e., vertical and horizontal lengths as viewed in a plan view) of the pn structures may be different. Furthermore, the first and second photodiodes that constitute the infrared detection element 11 and the temperature characteristic compensation element 21 may not have pn structures, but may have, for example, pin structures.

A p-type layer and an n-type layer of the pn structure (or pin structure) are made of a compound including at least one of In (indium) and Sb (antimony), for example. Among these, InSb and InAsSb are materials especially suitable for the present invention because InSb and InAsSb have small band gaps which are suitable for detecting an infrared ray with about 3 μm to 10 μm wavelength, and because the temperature dependence of the resistance is large. The first photodiode that constitutes the infrared detection element II and the second photodiode that constitutes the temperature characteristic compensation element 21 are configured so that the infrared ray enters the junctions of the pn junctions in an identical manner.

Figure 2:
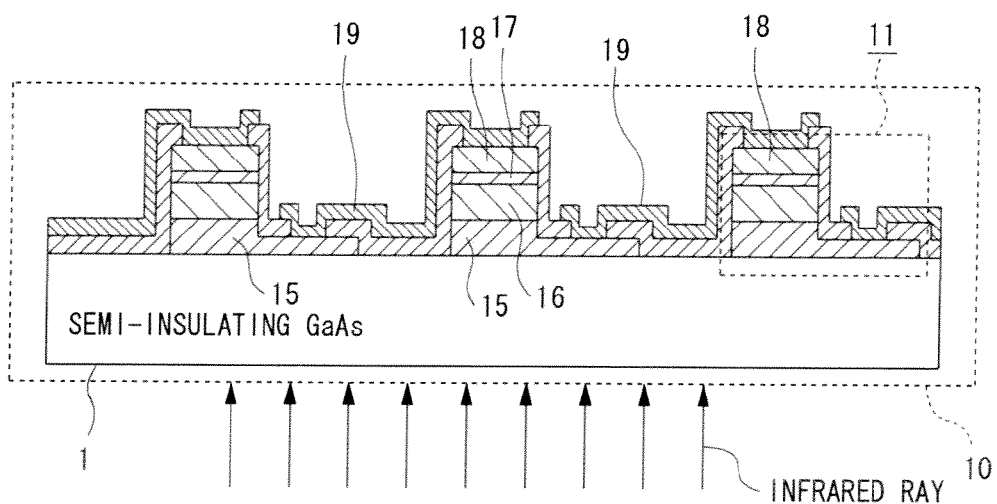
FIG. 2 is a cross-sectional view showing a configuration example of a light receiving unit 10.

FIG. 2 is a cross-sectional view showing a configuration example of the light receiving unit 10. The light receiving unit 10 is constituted by, for example, 1500 infrared detection elements 11 connected in series on the semi-insulating GaAs substrate 1. Each of the infrared detection elements 11 is made of an InSb quantum type pin photodiode. The photodiodes in the light receiving unit 10 are connected in series by interconnections 19. As shown with solid line arrows in FIG. 2, in the light receiving unit 10, when an infrared ray enters from the back surface (i.e., opposite the surface where the photodiodes are formed) of the substrate 1, the photo-voltage corresponding to the amount of infrared radiation is generated from the photodiodes, and the photo-voltage is outputted outside the light receiving unit 10 through the interconnections 19.

The layers that constitute the infrared detection element (photodiode) 11 will be described. In FIG. 2, a first compound semiconductor layer 15, a second compound semiconductor layer 16, a third compound semiconductor layer 10, and a fourth compound semiconductor layer 18 are sequentially grown on the substrate 1 in each photodiode. Any material can be used as a material of the first compound semiconductor layer 15 as long as the material contains indium (In) and antimony (Sb), and preferably, InSb or $InAs_xSb_{1-x}$ ($0 \leq x \leq 1$) is used as a material. Among the compound semiconductors, $InAs_xSb_{1-x}$ ($0 \leq x \leq 1$) has particularly high carrier mobility.

Therefore, the sheet resistance can be reduced, and efficient photoelectric conversion of an infrared ray with about 10 μm wavelength emitted from human body is possible. The film thickness of the first compound semiconductor layer 15 is, for example, 0.1 μm or more to 1 μm or less.

Any material can be used as a material of the second compound semiconductor layer 16 as long as the material contains indium (In) and antimony (Sb), and preferable materials include InSb, $InAs_xSb_{1-x}$ ($0 \leq x \leq 1$), and InSbN. The film thickness of the second compound semiconductor layer 16 is, for example, 0.5 μm or more to 4 μm or less.

A material with larger band gap than the second compound semiconductor layer 16 is used as a material of the third compound semiconductor layer 17. Any of AlInSb, GaInSb, AlAs, GaAs, InAs, AlSb, GaSb, AlAsSb, GaAsSb, AlGaSb, AlGaAs, AlInAs, GaInAs, AlGaAsSb, AlInAsSb, GaInAsSb, AlGaInSb, AlGaInSb, and AlGaInAsSb is preferably used as the material. The film thickness of the third compound semiconductor layer 17 is, for example, 0.02 μm or more.

The fourth compound semiconductor layer 18 is preferably made of a material with low contact resistance to the interconnections 19, and for example, a material in which p-type impurities are highly doped is preferably used. Although any material can be used as such a material as long as the material contains, for example, indium (In) and antimony (Sb), a more preferable material is InSb having high carrier mobility. The film thickness of the fourth compound semiconductor layer 18 is, for example, 0.1 μm or more to 2 μm or less.

As shown in FIG. 2, the infrared detection elements (photodiodes) 11 are consecutively connected in series by the interconnections 19. More specifically, in FIG. 2, the first compound semiconductor layer 15 of the photodiode arranged at the center of the drawing and the fourth semiconductor layer 18 of the photodiode arranged on the right side of the first compound semiconductor layer 15 are connected in series by the interconnection 19. The fourth compound semiconductor layer 18 of the photodiode arranged at the center of the drawing and the first compound semiconductor layer 15 of the photodiode arranged on the left side of the fourth compound semiconductor layer 18 are connected in series by the interconnection 19. Although not shown, each of the photodiodes located at both ends or the serial connection is connected to an electrode pad.

Connecting the photodiodes in series this way enables to add up the output voltages (electromotive voltages) generated by the incidence of infrared rays and enables to dramatically enhance the output voltage of the entire light receiving unit 10.

Meanwhile, the temperature characteristic compensation element 21 has an identical configuration to the infrared detection element 11 shown in FIG. 2, and is configured so that the infrared ray can enter each junction of the pn junction in an identical manner to the infrared detection element 11. In other words, in both of the infrared detection element 11 and the temperature characteristic compensation element 21, the first compound semiconductor layer 15, the second compound semiconductor layer 16, the third compound semiconductor layer 17, and the fourth compound semiconductor layer 18 are sequentially grown on the identical substrate 1. The infrared detection element 11 and the temperature characteristic compensation element 21 are constituted by photodiodes that take in infrared rays in an identical manner.

No light shielding film that completely shields the incidence of infrared rays is formed above and below the infrared detection element 11 and the temperature characteristic compensation element 21, both of which having an identical configuration. More specifically, the configuration of the present invention is different from a configuration in which infrared rays can enter the infrared detection element 11 and a light shielding film is formed on the temperature characteristic compensation element 21 so as to shield the incidence of infrared rays.

Furthermore, no insulation portion that actively blocks entering and exiting of heat is installed around the infrared detection element 11 and the temperature characteristic compensation element 21, both of which having an identical configuration. The insulation portion herein refers to an insulating material arranged around the element that blocks entering and exiting of heat to and from a part other than the element and is a cavity arranged on a platform or a substrate on which the element is formed. More specifically, the configuration of the present invention is different from a configuration in which an insulating material that blocks entering and exiting of heat is formed around the infrared detection element 11 and no insulating material is formed on the temperature characteristic compensation element 21. The configuration of the present invention is also different from a configuration in which a cavity that blocks entering and exiting of heat from the substrate is formed at the bottom of the infrared detection element 11 and no cavity is formed on the temperature characteristic compensation element 21.

As described, having the identical configuration, the infrared detection element 11 and the temperature characteristic compensation element 21 of the present invention are placed under the same environment.

Publicly known manufacturing processes are used for manufacturing such a photodiode.

Returning to FIG. 1, the terminals on the cathode side of the plural infrared detection elements (photodiodes) 11 connected in series in n stages included in the light receiving unit 10 are connected to the reference voltage generating circuit 51, and the terminals on the anode side are connected to the non-inverting input terminal (+ input terminal) of the operational amplifier circuit 53. The terminals on the anode side of one or m temperature characteristic compensation elements (photodiodes) 21 connected in series included in the correction unit 20 are connected to the reference voltage generating circuit 51, and the terminals on the cathode side are connected to the inverting input terminal (− input terminal) of the operational amplifier circuit 53. With these connections, a reference voltage VREF generated by the reference voltage generating circuit 51 is applied to the cathode side of the infrared detection elements 11 and the anode side of the temperature characteristic compensation elements 21.

The operational amplifier circuit 53 is a circuit that amplifies (voltage amplification) an output signal of the Infrared detection element 11. The resistive element 55, which is a feedback resistor, is connected between the output terminal 57 and the inverting input terminal. An output signal (hereinafter also referred to as an output voltage) Vout of the infrared sensor 100 is extracted from the output terminal 57.

Next, an operational example of the infrared sensor 100 will be described.

In FIG. 1, when an infrared ray is irradiated on the light receiving unit 10, each of the plural infrared detection elements (photodiodes) 11 connected in series in n stages receives the infrared ray. An electric current corresponding to the amount of light received is generated, and an output voltage expressed by the product of the electric current corresponding to the amount of light received and the internal resistance is generated at both ends of the infrared detection element 11. Therefore, the sum of the output voltages of the infrared detection elements 11 is generated at both ends of the light receiving unit 10.

Meanwhile, formed of exactly the identical material and configuration as the infrared detection element 11, the temperature characteristic compensation element 21 has an internal resistance with the temperature characteristic similar to the Internal resistance of the infrared detection element 11. Furthermore, the infrared detection element 11 and the temperature characteristic compensation element 21 are formed on the identical substrate 1 and have a configuration such that an infrared ray enters in an identical manner, and therefore, a rise in the internal temperature or a change in the ambient temperature in response to the incidence of the infrared ray occurs in the identical manner. In other words, the infrared detection element 11 and the temperature characteristic compensation element 21 have a substantially identical temperature whether or not an infrared ray is irradiated.

By the way, once an infrared ray enters the infrared detection element 11, which is a quantum type detector, a photocurrent is generated in proportion to the light energy. The output voltage (electromotive voltage) of the infrared detection element 11 is expressed by the product of the internal resistance of the infrared detection element 11 and the photocurrent. An internal resistance RO of the infrared detection element 11 is temperature-dependent, and for example, the internal resistance RO gets smaller as the temperature rises. Therefore, the output voltage of the infrared detection element 11 significantly changes along with a large change in she Internal resistance with respect to a temperature change.

A gain G of the operational amplifier circuit 53 is expressed with following equation (1), where the internal resistance of the temperature characteristic compensation element 21 is R1, and the resistance of the resistive element 55 is R2.

$$G = 1 + (R2/R1) \qquad (1)$$

For example, if the ambient temperature rises, the internal resistance of the infrared detection element 11 decreases, and the output voltage of the infrared detection element 11 decreases. However, the internal resistance R1 of the temperature characteristic compensation element 21 also decreases in accordance with the rise in the ambient temperature in an identical manner to the infrared detection element 11, whereby the gain G of the operational amplifier circuit 53 increases based on equation (1). As a result, the output voltage Vout of the operational amplifier circuit 53 is temperature-compensated.

Meanwhile, the internal resistance of the infrared detection element 11 increases as the ambient temperature drops, and the output voltage of the infrared detection element 11 increases as well. However, the internal resistance R1 of the temperature characteristic compensation element 21 increases in accordance with drop m the ambient temperature in an identical manner to the infrared detection element 11, and therefore, the gain G of the operational amplifier circuit 53 decreases based on equation (1). As a result, the output voltage Vout of the operational amplifier circuit 53 is temperature-compensated.

In this way, the temperature change of the output voltage (electromotive voltage) of the infrared detection element 11 is canceled by the change in the internal resistance of the temperature characteristic compensation element 21. The temperature characteristic of the temperature characteristic compensation element 21 enables to offset the temperature characteristic of the infrared detection element 11. Thus, the variation dependent on the temperature of the output voltage Vout of the operational amplifier circuit 53 can be reduced.

Figure 3:
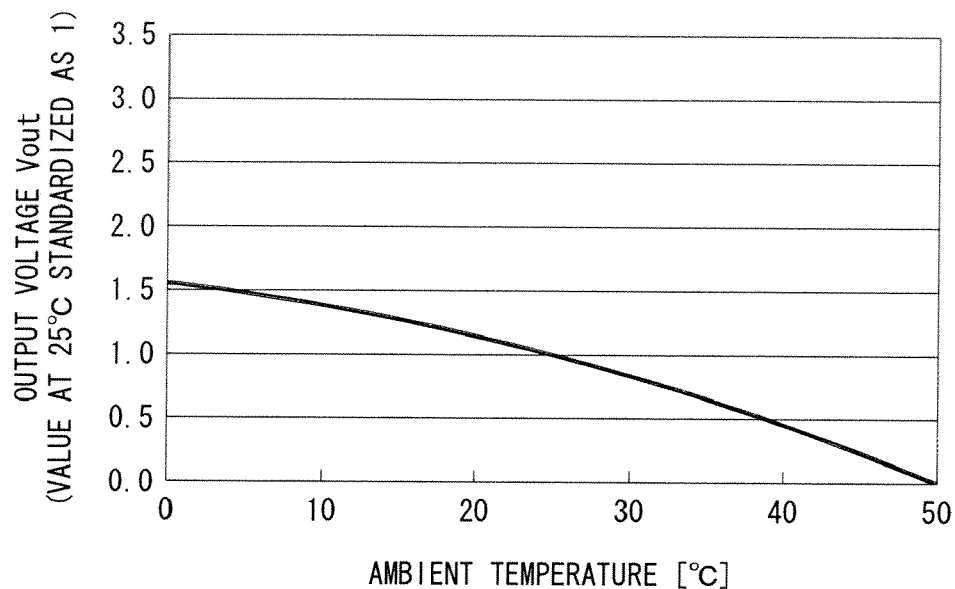
FIG. 3 is a diagram showing one example of a measurement result of an output voltage Vout of the infrared sensor 100.

FIG. 3 shows one example of a measurement result of the output voltage Vout of the infrared sensor 100. The horizontal axis (X axis) of FIG. 3 indicates the ambient temperature, while the vertical axis (Y axis) indicates the output voltage Vout of the infrared sensor 100. In this example, the output voltage when the ambient temperature is 25° C. is standardized as "1". As shown in FIG. 3, the output voltage Vout decreases along with the rise in the ambient temperature. However, the ratio of the decrease in the output voltage Vout is moderate when compared to the case in which the temperature characteristic compensation element 21 is not used.

In this way, according to the first embodiment of the present invention, the temperature change of the electromotive voltage can be canceled by the temperature characteristic compensation element 21, even when extracting the electromotive force of the infrared detection element 11 for amplification by forming the infrared detection element 11 and the temperature characteristic compensation element 21 with the identical material on the identical substrate 1 and further providing the identical structure so that an infrared ray enters in the identical way. In other words, the temperature dependency of the output signal Vout of the infrared sensor 100 can be reduced, and the temperature characteristic of the output signal Vout can be made equivalent to the temperature characteristic of the electromotive current (photocurrent) of the infrared detection element 11. Therefore, the electrical signal converted by the light receiving unit 10 can be corrected with high accuracy, and the energy of an infrared ray can be detected with higher accuracy.

Although the temperature characteristic compensation element 21 may have any form as long as the temperature characteristic of the internal resistance of the element is similar to that of the infrared detection element 11, the identical material and the identical configuration are more preferable so that the temperature coefficients are equalized.

The resistance value of the resistive element 55 in an actual circuit needs to be within a value with a certain limit. In order to do so, the infrared detection elements 11 are configured in multistage in n stages in which the output voltage (electromotive voltage) can be increased, the temperature characteristic compensation elements 21 that determine the gain are configured in multiple stages in one or m stages, and the infrared detection elements 11 and the temperature characteristic compensation elements 21 can be combined in different ways. This enables to accomplish the output voltage of the infrared detection elements 11 that is not affected by the input offset voltage of the operational amplifier circuit 53. This also enables to set up the resistive element 55 to an appropriate value to determine an arbitrary gain, thereby attaining the optimal circuit. In this regard, it is more preferable that the infrared detection elements 11 and the temperature characteristic compensation elements 21 be configured in multistage.

A case where a quantum pin photodiode is used as a resistor (i.e., characteristic compensation element) having the identical temperature characteristic to the infrared detection element has been described herein. As is generally known, a diode exhibits a rectifying effect, and the current is apt to flow in the forward bias direction and less apt to flow in the reverse bias direction.

However, when the current flowing through the photodiode is extremely small (for example, when the current is −1.0E-6 to 1.0E-6[A]), the current is generated in the forward bias direction as well as in the reverse bias direction in the identical manner, and the linearity can be observed in the current-voltage characteristic. Used in an extremely small current range and exhibiting linearity in the current-voltage characteristic, the quantum pin photodiode described in the embodiment of the present invention can be used as a resistor.

As the temperature of the photodiode rises, the gradient (i.e., inverse of the internal resistance) of the current-voltage characteristic becomes, for example, larger. When the temperature of the photodiode drops, the gradient (i.e., inverse of the internal resistance) of the current-voltage characteristic becomes, for example, smaller. As described, since the current flowing through the photodiode is extremely small in the embodiment of the present invention, the photodiode can be considered as a variable resistor, i.e. temperature compensation element, having resistance dependent on temperature.

(2) Second Embodiment

Figure 4:
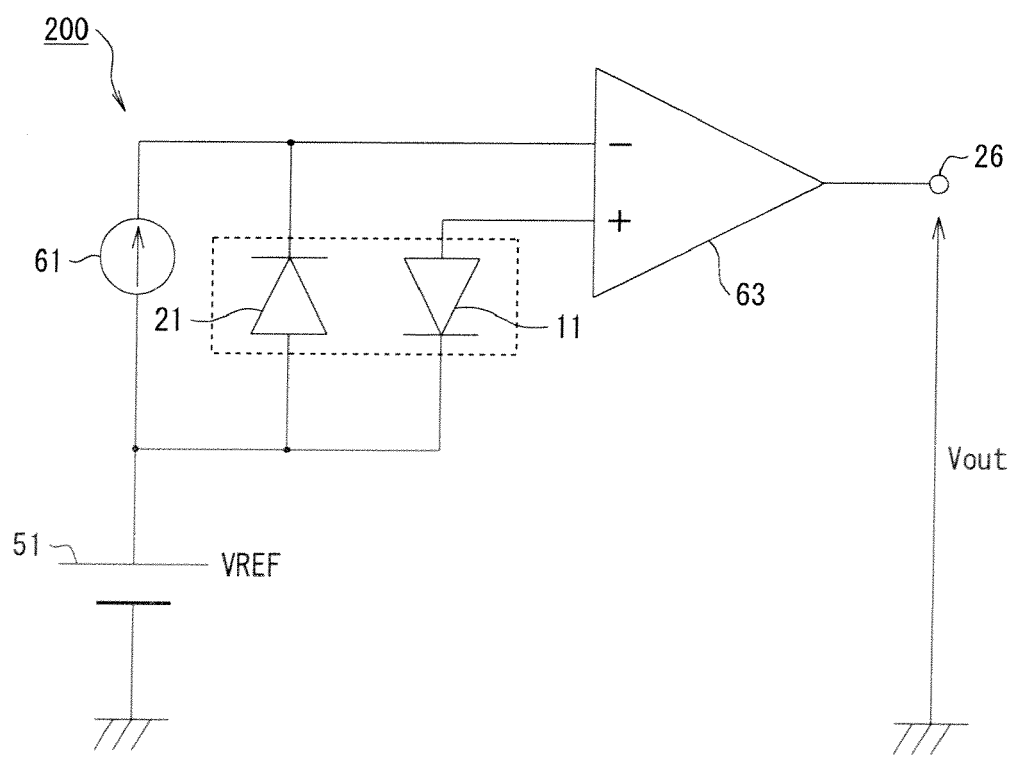
FIG. 4 is a schematic diagram showing one configuration example of an infrared sensor 200 according to a second embodiment of the present invention.

FIG. 4 is a schematic diagram showing a configuration example of an Infrared sensor 200 according to a second embodiment of the present invention. In FIG. 4, like reference numerals are applied to parts having like configurations and like functions as in FIG. 1, and the detailed description will not be repeated.

As shown in FIG. 4, the infrared sensor 200 comprises the quantum infrared detection element 11, the temperature characteristic compensation element 21, the reference voltage generating circuit 51, a constant current circuit 61, a comparator circuit 63, and an output terminal 26. The infrared detection element 11 is a light receiving unit, and the temperature characteristic compensation element 21 is a correction unit. As in the first embodiment, the infrared detection element 11 and the temperature characteristic element 21 are formed adjacent to each other on the identical substrate 1 so that the influence from the ambient temperature is the same. The infrared detection element 11 and the temperature characteristic compensation element 21 are, for example, quantum type pin photodiodes, and these photodiodes are formed of the identical material and have the identical configuration so that the infrared ray enters in the identical manner.

The constant current circuit 61 is a current source that supplies a constant current to the temperature characteristic compensation element 21. The constant current circuit 61 generates a desired constant current and supplies the generated constant current to the temperature characteristic compensation element 21. The comparator circuit 63 compares an output signal (voltage) of the infrared detection element 11 and an output signal (voltage) of the temperature characteristic compensation element 21 and outputs the result.

As shown in FIG. 4, the terminal on the cathode side of the infrared detection element (photodiode) 11 is connected to the reference voltage generating circuit 51, and the terminal on the anode side is connected to the non-inverting input terminal (+ input terminal) of the comparator circuit 63. The terminal on the anode side of the temperature characteristic compensation element (photodiode) 21 is connected to the reference voltage VREF, and the terminal on the cathode side is connected to the inverting input terminal (− input terminal) of the comparator circuit 63. With such connections, the reference voltage VREF generated by the reference voltage generating circuit 51 is applied to each of the cathode side of the infrared detection element 11 and the anode side of the temperature characteristic compensation element 21.

The constant current circuit 61 is connected in parallel to the temperature characteristic compensation element 21 to thereby supply a desired constant current from the constant current circuit 61 to the temperature characteristic compensation element 21. The temperature characteristic compensation element 21 then generates a voltage corresponding to the value of the internal resistance, and the generated voltage is supplied to the inverting input terminal of the comparator circuit 63 as a threshold voltage (reference voltage).

An operational example of the infrared sensor 200 will now be described. In FIG. 4, when an infrared ray is directed onto the infrared detection element 11, a current corresponding to the amount of light received is generated, and an output voltage (electromotive voltage) is generated at both ends of the infrared detection element 11. The output voltage is inputted to the non-inverting input terminal of the comparator circuit 63. Meanwhile, an infrared ray enters the temperature characteristic compensation element 21 in the identical manner to the infrared detection element 11, and a voltage is generated at both ends of the temperature characteristic compensation element 21. The voltage is inputted to the inverting input terminal of the comparator circuit 63 as a threshold voltage. The comparator circuit 63 outputs an H (high)level when the output voltage of the infrared detection element 11 becomes larger than the threshold voltage and outputs an L (low)level when the output voltage becomes smaller than the threshold voltage.

Since the temperature characteristic compensation element 21 is formed of the identical material and has the identical configuration to the infrared detection element 11, the internal resistance has a temperature characteristic similar to that of the infrared detection element 11. Furthermore, formed on the identical substrate 1, the infrared detection element 11 and the temperature characteristic compensation element 21 tend to have the identical temperature, thereby changing in the identical manner in accordance with the change in the ambient temperature.

The output voltage (electromotive voltage) of the infrared detection element 11 significantly changes in accordance with the significant change in the internal resistance with respect to the temperature change. For example, the internal resistance of the infrared detection element 11 increases as the ambient temperature drops, and the output voltage increases as a consequence. Therefore, the input voltage of the non-inverting input terminal of the comparator circuit 63 increases. In this case, the internal resistance of the temperature characteristic compensation element 21 also increases, and the voltage generated at both ends of the temperature characteristic compensation element 21 increases. As a result, the threshold voltage of the inverting input terminal of the comparator circuit 63 increases.

On the other hand, the internal resistance of the infrared detection element 11 decreases when the ambient temperature rises, and the output voltage decreases. As a result, the input voltage of the non-Inverting input terminal of the comparator circuit 63 decreases. In this case, the internal resistance of the temperature characteristic compensation element 21 also decreases, and the voltage generated at both ends of the temperature characteristic compensation element 21 decreases, and thus, the threshold voltage of the inverting input terminal of the comparator circuit 63 decreases. Therefore, the threshold for switching the output signal Vout, of the output terminal 26 of the comparator circuit 63, to H or L becomes less temperature-dependent.

As described, according to the second embodiment of the present invention, the output signal Vout can be made less temperature-dependent because the infrared detection element 11 and the temperature characteristic compensation element 21 are formed of the identical material on the identical substrate 1 as in the first embodiment. Therefore, the electric signal converted by the light receiving unit 10 can be corrected with higher accuracy, and the infrared energy can be detected with high accuracy.

It is preferable that the comparator circuit 63 exhibit hysteresis, although configured not to exhibit hysteresis in the second embodiment. In that case, the current value of the constant current circuit 61 is changed for a predetermined value in accordance with the inversion of the output of the comparator circuit 63 to cause the threshold voltage to exhibit hysteresis.

(3) Third Embodiment

Figure 5:
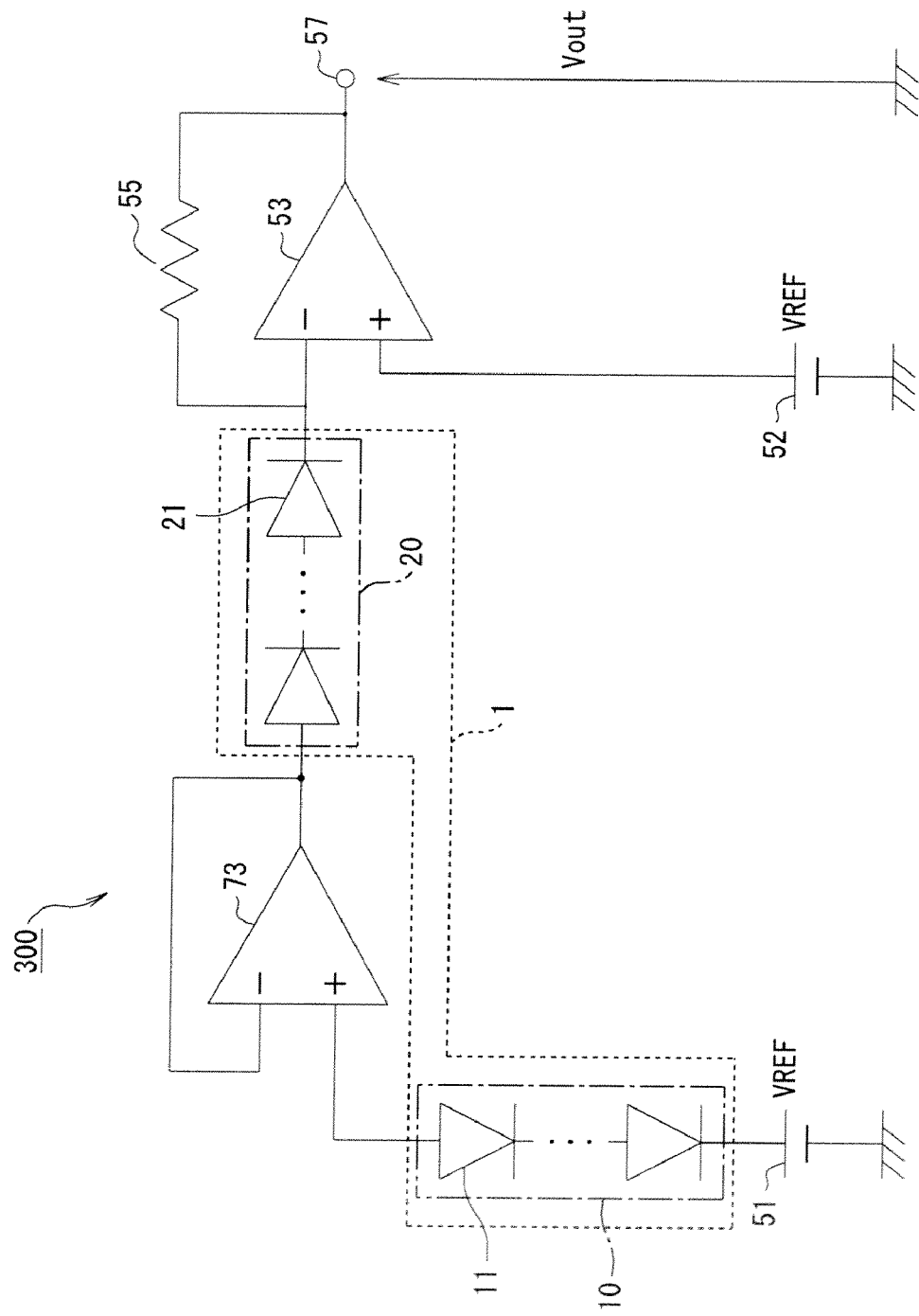
FIG. 5 is a schematic diagram snowing a configuration example of an infrared sensor 300 according to a third embodiment of the present invention.

FIG. 5 is a schematic diagram showing a configuration example of the infrared sensor 300 according to a third embodiment of the present invention. In FIG. 5, like reference numerals are applied to parts having like configurations and like functions as in FIG. 1, and the detailed description will not be repeated.

As shown in FIG. 5, the infrared sensor 300 comprises the light receiving unit 10 including the quantum infrared detection element 11, the correction unit 20 including the temperature characteristic compensation element 21, reference voltage generating circuits 51 and 52, operational amplifier circuit 53 and 73, the resistive element 55, and the output terminal 57. As in the first embodiment, the infrared detection element 11 and the temperature characteristic compensation element 21 are formed on the identical substrate 1 adjacent to each other so that the influence from the ambient temperature is the same. The infrared detection element 11 and the temperature characteristic compensation element 21 are, for example, quantum pin photodiodes, and the photodiodes are formed of the Identical material and have the identical configuration so that the infrared ray enters in the Identical manner.

As shown in FIG. 5, in one or m infrared detection elements (photodiodes) 11 connected in series and included in the light receiving unit 10, the terminal on the cathode side is connected to the reference voltage generating circuit 51, and the terminal on the anode side is connected to the non-inverting input terminal (+ input terminal) of the operational amplifier circuit 73. The output terminal of the operational amplifier circuit 73 is connected to the inverting input terminal (− input terminal) of the operational amplifier circuit 73 to constitute a voltage follower circuit.

In one or m temperature characteristic compensation elements (photodiodes) 21 connected in series and included in the correction unit 20, the terminal on the cathode side is connected to the inverting input terminal (− input terminal) of the operational amplifier circuit 53. The non-inverting input terminal (+ input terminal) of the operational amplifier circuit 53 is connected to the reference voltage generating circuit 52, and the inverting input terminal (− input terminal) is connected to the output terminal of the operational amplifier circuit 53 through the resistive element 55 to constitute an inverting amplifier circuit, unlike the non-inverting amplifier circuit in the first embodiment.

The output terminal of the operational amplifier circuit 73 is connected to the terminal on the anode side of one or m temperature characteristic compensation elements (photodiodes) 21 connected in series and included in the correction unit 20, so that the voltage follower circuit and the inverting amplifier circuit are connected in cascade.

Next, an operational example of the infrared sensor 300 will be described.

In FIG. 5, as in the first embodiment, an output voltage expressed by the product of the current corresponding to the amount of light received and the internal light is generated at both ends of the infrared detection element 11 when an infrared ray is directed to the light receiving unit 10. Thus, the sum of the output voltages of the infrared detection elements 11 is generated at both ends of the light receiving unit 10.

Meanwhile, as in the first embodiment, the temperature characteristic compensation element 21 is made of exactly the identical material and has the identical configuration as the infrared detection element 11 and is formed on the identical substrate 1 as the infrared detection element 11. Therefore, the infrared detection element 11 and the temperature characteristic compensation element 21 have a substantially identical temperature, whether or not an infrared ray is irradiated.

The gain G of the operational amplifier circuit 53 is expressed with following equation (2), where the internal resistance of the temperature characteristic compensation element 21 is R1, and the resistance of the resistive element 55 is R2.

$$G=-(R2/R1) \qquad (2)$$

For example, as the ambient temperature rises, the Internal resistance of the infrared detection element 11 decreases, the output voltage of the infrared detection element 11 decreases, and the output of the operational amplifier circuit 73 decreases. However, the internal resistance R1 of the temperature characteristic compensation element 21 also decreases in accordance with the rise in the ambient temperature in the identical manner to the infrared detection element 11, and the voltage follower circuit and the inverting amplifier circuit are connected in cascade. Thus, the gain G of the operational amplifier circuit 53 increases based on equation (2). As a result, the output voltage Vout of the operational amplifier circuit 53 is temperature-compensated.

Meanwhile, as the ambient temperature drops, the internal resistance of the infrared detection element 11 increases, the output voltage of the infrared detection element 11 increases, and the output of the operational amplifier circuit 73 increases. However, the internal resistance R1 of the temperature characteristic compensation element 21 also increases in accordance with the drop in the ambient temperature in the identical manner to the infrared detection element 11, and the voltage follower circuit and the inverting amplifier circuit are connected in cascade. Thus, the gain G of the operational amplifier circuit 53 decreases based on equation (2). As a result, the output voltage Vout of the operational amplifier circuit 53 is temperature-compensated.

In this way, as in the first embodiment, the temperature change of the output voltage (electromotive voltage) of the infrared detection element 11 is canceled by the change in the internal resistance of the temperature characteristic compensation element 21. The temperature characteristic of the temperature characteristic compensation element 21 can offset the temperature characteristic of the infrared detection element 11. Thus, the variation dependent on the temperature of the output voltage Vout of the operational amplifier circuit 53 can be reduced.

(4) Fourth Embodiment 4.1) First Configuration Example

Figure 6:
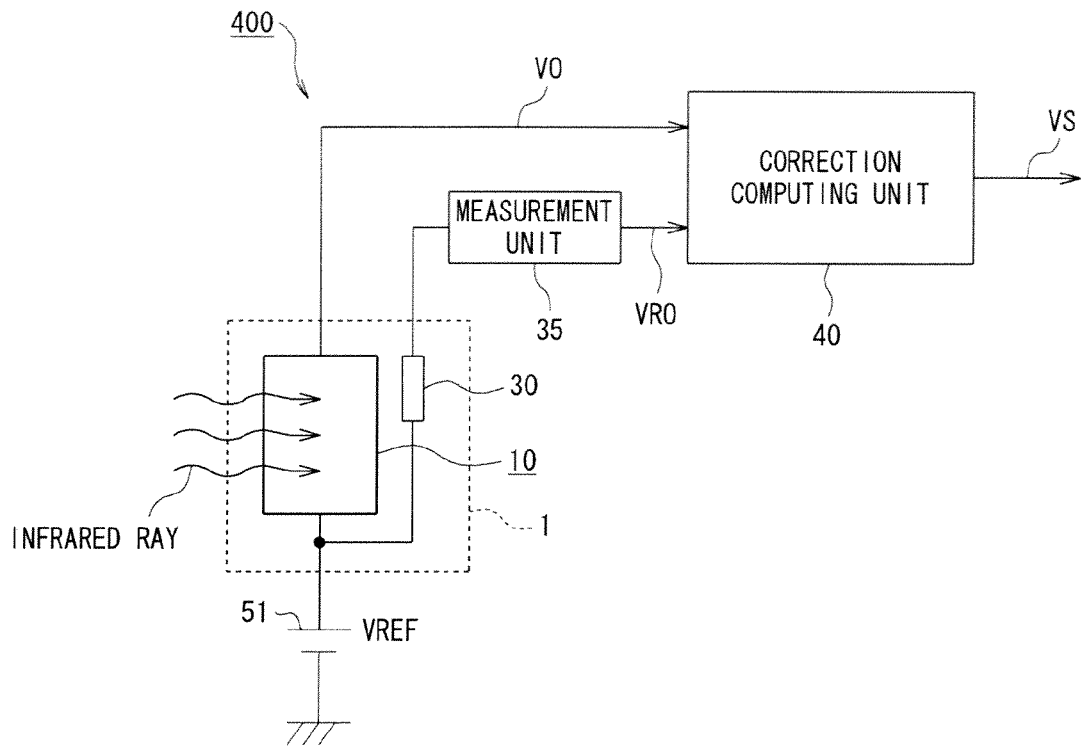
FIG. 6 is a schematic diagram showing a configuration example of an infrared sensor 400 according to a fourth embodiment of the present invention.

FIG. 6 is a schematic diagram showing a configuration example of an infrared sensor 400 according to a fourth embodiment of the present invention. In FIG. 6, like reference numerals are applied to parts having like configurations and like functions as in FIGS. 1 and 4, and the detailed description will not be repeated.

As shown in FIG. 6, the infrared sensor 400 comprises the substrate 1, the light receiving unit 10 including a quantum infrared detection element, a correction unit including a temperature measuring element 30, a measurement unit 35, a correction computing unit 40, and the reference voltage generating circuit 51.

As described, the light receiving unit 10 is constituted by infrared detection elements (for example, photodiodes) connected in series in n stages, and is a part that converts the infrared energy to electric energy by photoelectric conversion. Since the infrared detection element is a quantum-type detector, the Infrared detectability of the light receiving unit 10 is not affected by heat energy of the light receiving unit 10 or heat energy on the periphery. For example, as described with reference to FIG. 2, the light receiving surface of the infrared detection element included in the light receiving unit 10 is constituted by, for example, $InAs_xSb_{1-x}$ ($0 \leq x \leq 1$), allowing efficient photoelectric conversion of an infrared ray having about 10 µm wavelength emitted from human body.

The temperature measuring element 30 is an element that reacts to the temperature and can be constituted by a thermistor, thermocouple, semiconductor pn photodiode, pin photodiode, or the like. A case where the temperature measuring element 30 is constituted by a pin photodiode is illustrated herein as one example.

The light receiving unit 10 is constituted by the first photodiode, while the temperature measuring element 30 is constituted by the third photodiode.

Therefore, the temperature measuring element 30 is formed of the identical configuration and the identical material as the infrared detection element included in the light receiving unit 10.

The light receiving unit 10 and the temperature measuring element 30 have the identical configuration so that the infrared ray enters in the identical manner, and no light shielding film that completely shields the incidence of infrared rays is installed above and below the light receiving unit 10 and the temperature measuring element 30, both of which having the identical structure. More specifically, the configuration of the present invention is different from a configuration in which infrared rays can enter the infrared detection element 11 and a light shielding film is formed on the temperature measuring element 30 so as to shield the incidence of infrared rays.

Furthermore, no insulation portion that actively blocks entering and exiting of heat is installed around the infrared detection element 11 and the temperature characteristic compensation element 21, both of which having the identical configuration. The insulation portion herein refers to an insulating material arranged around the element, blocking entering and exiting of heat to and from a part other than the element, and is a cavity arranged on a platform or on a substrate on which the element is formed. Thus, the configuration of the present invention is different from a configuration in which an insulating material that blocks entering and exiting of heat is formed around the infrared detection element 11 and no insulating material is formed on the temperature measuring element 30. The configuration of the present invention is also different from a configuration in which a cavity that blocks entering and exiting of heat from substrate is formed at the bottom of the infrared detection element 11 and no cavity is formed on the temperature measuring element 30.

In this way, the light receiving unit 10 and the temperature measuring element 30 are formed on the identical substrate 1 adjacent to each other so that the influence of the ambient temperature is the same, and the light receiving unit 10 and the temperature measuring element 30 constitute one infrared sensor chip. The number of photodiodes constituting the temperature measuring element 30 may be one or more. An example is that plural photodiodes are connected in series.

The temperature measuring element 30 may be a thermistor. In that case, a power source is required to measure the electrical resistance (hereinafter simply referred to as "resistance") of the thermistor. For example, a certain current is applied to the thermistor, and the measurement unit 35 measures the potential difference (voltage value) at both ends of the thermistor at that point. The resistance value of the thermistor is calculated from the voltage value measured by the measurement unit 35, and since the resistance value of the thermistor and the temperature are correlated, the temperature can be found from the voltage value. This is the simplest temperature measurement method. The measurement unit 7 is not necessarily required if the temperature measuring element 30 is a thermocouple because the electromotive force is generated in accordance with temperature. The electromotive force generated by the thermocouple may be directly outputted toward the correction computing unit 40.

The reference voltage generating circuit 51 is designed to generate a desired reference voltage to be applied to the light receiving unit 10 and the temperature measuring element 30. The reference voltage generating circuit 51 generates a desired reference voltage VREF based on the ground potential.

As shown in FIG. 6, one end of the light receiving unit 10 is connected to the correction computing unit 40, and the other end is connected to the reference voltage generating circuit 51. The electrical signal generated by photoelectric conversion in the light receiving unit 10 is outputted as a sensor output signal (hereinafter referred to as output signal or output voltage) VO to the correction computing unit 40. In FIG. 6, the output signal VO is, for example, an analog signal. One end of the temperature measuring element 30 is connected to the measurement unit 35, and the other end of the temperature measuring element 30 and the other end of the light receiving unit 10 are commonly connected to the reference voltage generating circuit 51.

As shown in FIG. 6, one end of the measurement unit 35 is connected to the correction computing unit, and the other end is connected to the temperature measuring element 30. The measurement unit 35 then outputs a signal including temperature information outputted from the temperature measuring element 30 to the correction computing unit 9. For example, the measurement unit 35 measures a voltage value proportional to the resistance of the temperature measuring element (photodiode) 30. As described, when the current flowing through the photodiode is extremely small (for example, when the current is −1.0E-6 to 1.0E-6[A]), the current flows in the forward bias direction and in the reverse bias direction in the identical manner, and the linearity can be observed in the current-voltage characteristic. Therefore, the photodiode can be considered as a resistor. The voltage value measured by the measurement unit 35 is outputted as a voltage signal VRO to the correction computing unit 40. In FIG. 1, the voltage signal VRO is, for example, an analog signal.

The correction computing unit 40 is provided with a function for correcting the output signal VO outputted from the light receiving unit 10 based on the voltage signal VRO outputted from the measurement unit 35 (or outputted directly from the temperature measuring element 30) and for outputting the corrected data outside the infrared sensor 400 as an output signal VS. The correction computing unit 40 is constituted by, for example, a logic IC and a memory device, and stored with a correction formula (relational expression) or the like for correcting the output signal VO based on the voltage signal VRO. The correction formula will be described in the section of "(4.3) Method of Obtaining Correction Formula" in a fourth embodiment. The output signal VS is, for example, an analog signal.

4.2) Second Configuration Example

Figure 7:
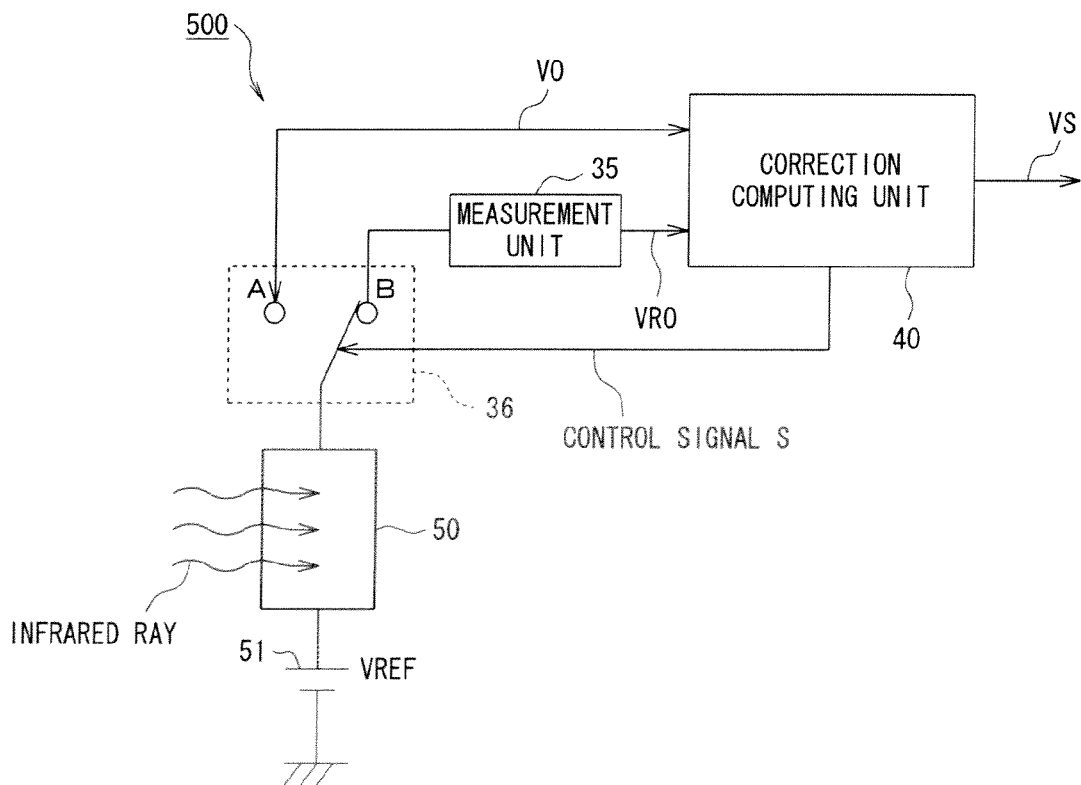
FIG. 7 is a schematic diagram showing a configuration example of an infrared sensor 500 according to the fourth embodiment of the present invention.

FIG. 7 is a schematic diagram showing a configuration example of an infrared sensor 500 of the fourth embodiment of the present invention. In FIG. 7, like reference numerals are applied to parts having like and the detailed description will not be repeated.

As shown in FIG. 7, the Infrared sensor 500 comprises the substrate 1, a light receiving unit 50, the measurement unit 35, a switching circuit 36, the correction computing unit 40, and the reference voltage generating circuit 51. The light receiving unit 50, like the light receiving unit 10, comprises quantum infrared detection elements connected in series in n stages and generates an electrical signal from infrared energy by photoelectric conversion. The specific configuration of the light receiving unit 50 is, for example, the same as that of the light receiving unit 10 shown in FIG. 2. However, unlike in the first configuration example, the light receiving unit 50 also serves as the temperature measuring element 30 in the second configuration example. In other words, the infrared sensor 500 photoelectrically converts the infrared ray in the light receiving unit 50 and finds the temperature of the light receiving unit 50 from the resistance of the light receiving unit 50.

Explaining with an example, the light receiving unit 50 is constituted by plural infrared detection elements (photodiodes) 11 as shown in FIG. 2, and the plural infrared detection elements 11 are connected in series by the interconnections 19. The measurement unit 35 measures the resistance value between one end and the other end of the series. For example, a voltage proportional to the resistance value is generated at both ends when a certain current is applied to the light receiving unit 50. The generated voltage is measured by the measurement unit 35, and the measurement result is outputted as a voltage signal VRO to the correction computing unit 40. The voltage signal VRO is, for example, an analog signal. The switching circuit 36 is designed to receive a control signal S from the correction computing unit 40 to thereby connect one end of the light receiving unit 50 to a terminal A or to a terminal B.

The reference voltage generating circuit 51 is designed to generate a desired reference voltage to be applied to the light receiving unit 50. The reference voltage generating circuit 51 generates a desired reference voltage VREF based on the ground potential.

As described, the correction computing unit 40 comprises the function for correcting the output signal VO outputted from the light receiving unit 50 based on the voltage signal VRO outputted from the measurement unit 35 and then outputting the corrected data outside the infrared sensor 500 as a signal VS. The output signal VS is, for example, an analog signal.

In the second configuration example, the correction computing unit 40 also comprises a function for switching the connections between the light receiving unit 50 and the terminals A and B. In order to obtain both of the output signal VO and the voltage signal VRO proportional to the resistance of the light receiving unit 50 from the light receiving unit 50, the correction computing unit 40 is designed to be able to periodically activate the switching circuit 36 to thereby alternately connect the light receiving unit 50 to the terminal A and the terminal B.

More specifically, when the switching circuit 36 switches the connection of the light receiving unit 50 to the terminal B, a certain current flows into the light receiving unit 50 from the measurement unit 35, and a voltage value proportional to the resistance of the light receiving unit 50 is measured by the measurement unit 35. The measured voltage value includes information related to the temperature of the light receiving unit 50 and is outputted as a voltage signal VRO to the correction computing unit 40. On the other hand, when the switching circuit 36 switches the connection of the light receiving unit 50 to the terminal A, the infrared ray entered into the light receiving unit 50 is converted to an output signal VO, which is then outputted to the correction computing unit

40. The output signal VO inputted to the correction computing unit 40 is corrected immediately before or immediately after the input of the signal VO, based on the voltage signal VRO most recently inputted to the correction computing unit 40.

With such a configuration, even when the temperature of the light receiving unit 50 is changed over the course of time, the output signal VO can be sequentially corrected in accordance with the change. Therefore, the detection accuracy of the infrared energy (i.e., accuracy of the output signal VS) can be maintained high, with almost no influence of the temperature change.

A low level voltage/current signal is preferably used in the infrared sensor 500 so that the light receiving unit 50 will not generate heat when the measurement unit 35 measures the resistance of the light receiving unit 50. A specific example of the photoelectric conversion element used in the long wavelength infrared light receiving unit 50 includes a photodiode with a pn or pin junction made of $InAs_xSb_{1-x}$ ($0 \leq x \leq 1$) semiconductor material as shown in FIG. 2. When such a photodiode is used as the light receiving unit 50, for example, an infrared ray with about 10 μm wavelength emitted from human body can be photoelectrically converted.

If the pn or pin photodiode is used, an open circuit voltage/short circuit current signal that is photoelectrically converted can be obtained even without applying a voltage/current bias The "photovoltaic force mode" herein denotes a mode for generating the open circuit voltage/short circuit current that is generated in the pn or photodiode without applying a bias voltage/current.

When such a pn or pin photodiode is used as the light receiving unit 50, the temperature information of the light receiving unit 50 can be obtained accurately by reading the resistance value near the zero bias without being affected by the photocurrent. A high-sensitive light receiving unit 50 is required depending on the application because the long wavelength infrared ray has low energy. However, the S/N ratio (signal to noise ratio) of the light receiving unit 50 can be improved by constituting the light receiving unit 50 with multi-stage photodiodes connected in series as shown in FIG. 2, for example.

As shown in FIG. 2, when the light receiving unit 50 is constituted by multi-stage pn or pin photodiodes connected in series, the resistance value near the zero bias also becomes high, and this may facilitate the resistance measurement. The use of multi-stage pn or pin photodiodes allows for the light receiving unit 50 to easily serve as a temperature measuring element. More specifically, the use of the multi-stage pn or pin photodiodes facilitates accomplishing the light receiving unit 50 provided with a resistance value whose output signal VO has a proper sized value and is easy to measure.

Although the cases where the voltage signal VRO and the signal VS are analog signals have been described in the first and second configuration examples, the voltage signal VRO and the signal VS are not limited to the analog signals, but may be digital signals depending on the application. For example, in the first configuration example, the configuration may be such that a digital signal VRO is outputted from the measurement unit 35 to the correction computing unit 40, the correction computing unit 40 performs digital computation with reference to the analog signal VO outputted from the light receiving unit 10 and the digital signal VRO outputted from the measurement unit 35, and the digital signal VS is outputted based on the result of the digital computation.

4.3) Method of Obtaining Correction Formula (Part 1)

A method of obtaining a correction formula (relational expression) to be stored in the correction computing unit 40 will now be described.

The correction formula can be obtained from an experiment using, for example, the infrared sensor 400 shown in FIG. 6 or the infrared sensor 500 shown in FIG. 7. However, an actual experiment in a configuration example of the infrared sensor 500 as shown in FIG. 8 is conducted herein, and a case of obtaining the correction formula from the result will be described.

Figure 8:
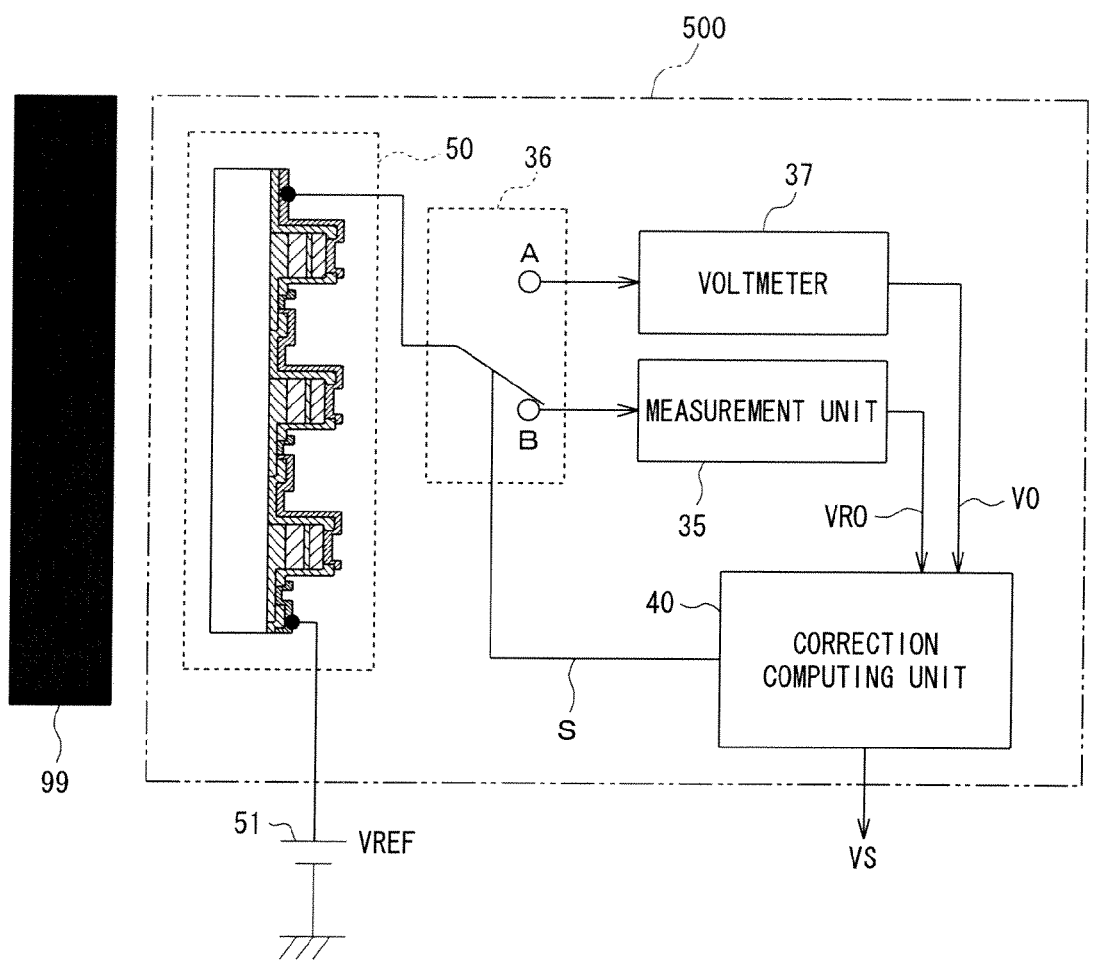
FIG. 8 is a schematic diagram showing a configuration example during an experiment of an infrared sensor 500.

FIG. 8 is a schematic diagram showing a configuration example during the experiment of the infrared sensor 500. As shown in FIG. 8, for example, a voltmeter 37 is installed between the terminal A and the correction computing unit 40 in this experiment to measure the amount of electric energy outputted from the light receiving unit 50. The value measured by the voltmeter 37 is outputted to the correction computing unit 10 as an output signal VO. In this example, the output signal VO outputted from the voltmeter 37 is a digital signal.

In this experiment, for example, a digital multi-meter is used as the measurement unit 35 that measures the resistance of the light receiving unit 50, and a digital computer is used as the correction computing unit 40. Furthermore, a blackbody furnace 99 capable of changing the radiation temperature setting is used as an infrared radiation source in this experiment. Additionally, the light receiving unit 50 is placed in a temperature-variable oven (not shown) to change the temperature of the light receiving unit 50.

The output of the infrared sensor 500 herein is a value proportional to the difference between the temperature of the object (blackbody furnace 99 herein) and the temperature of the light receiving unit 50. Therefore, the temperature of the object can be found if the output voltage of the infrared sensor 500 and the temperature of the light receiving unit 50 are known. The temperature of the light receiving unit 50 can be obtained by measuring the resistance of the light receiving unit 50, and the measurement result is plotted, for example, as in FIG. 9.

Figure 9:
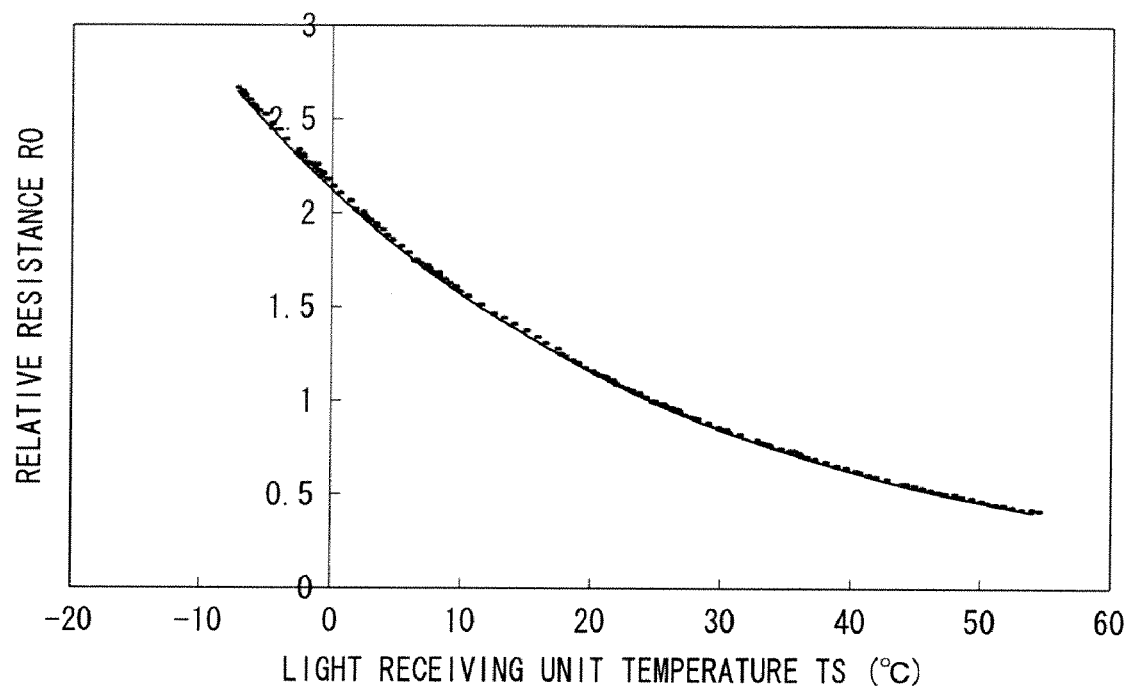
FIG. 9 is a diagram showing the relationship between a relative resistance RO and a temperature TS of a light receiving unit 50.

FIG. 9 is a diagram showing the relationship between a relative resistance RO and a temperature TS of the light receiving unit 50. The horizontal axis of FIG. 9 denotes the temperature TS [° C.] of the light receiving unit 50, while the vertical axis denotes the relative resistance RO of the light receiving unit 50. The relative resistance RO is a relative value employing a resistance value as a reference (i.e. 1), the resistance value measured by the measurement unit 35 when the temperature TS of the light receiving unit 50 is 25° C. The curve shown in FIG. 9 can be obtained, for example, by actually measuring the resistance value with a following method and then converting the value into the relative value with respect to the reference (i.e., converting to RO).

Thus, the light receiving unit 50 is placed in the oven. This makes the temperature of the light receiving unit 50 substantially the same as the temperature of the oven. While changing the temperature in the oven, the resistance value of the light receiving unit 50 placed in the oven is measured and converted to RO.

Before measuring the resistance value, the positions of the light receiving unit 50 and the blackbody furnace 99 are adjusted in advance so that the radiation of the blackbody furnace 99 is properly directed on the light receiving surface of the light receiving unit 50. The temperature of the light receiving unit 50 will be barely affected by the radiation from the blackbody furnace 99 because the light receiving unit 50 is placed in the oven. The curve in FIG. 9 can be obtained by measuring the resistance value with respect to the temperature TS using such a method and then plotting by converting the resistance value to RO. The curve is, for example, approximated to equation (3) using the least squares method.

$$RO = 2.123 e^{-0.03048 TS} \quad (3)$$

Figure 10:
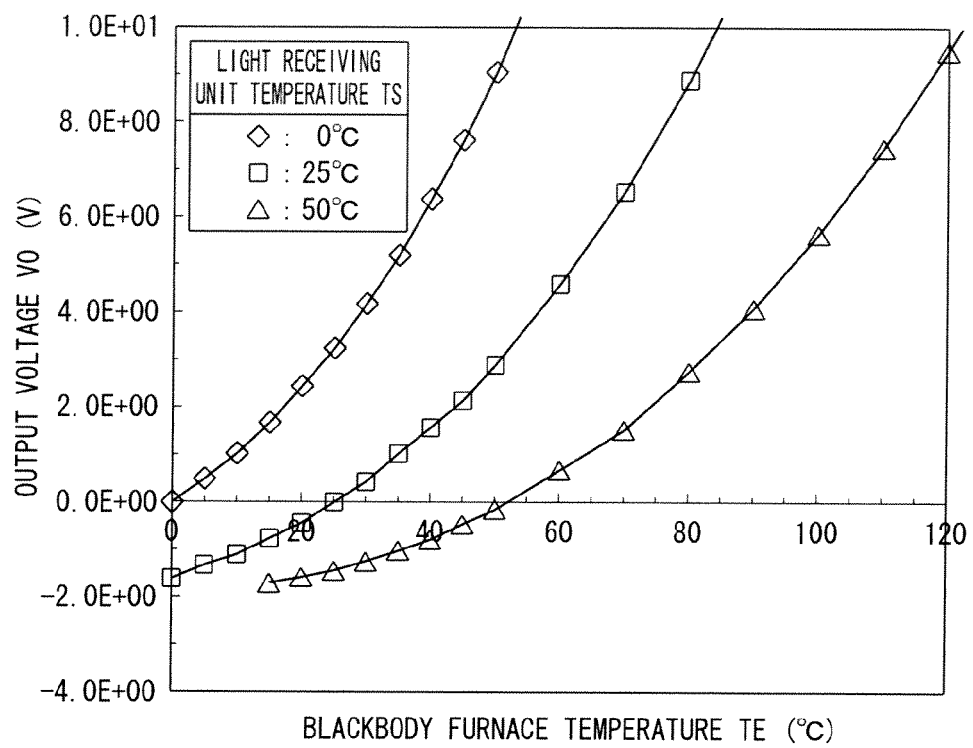
FIG. 10 is a diagram showing the relationship between the temperature TS and a temperature TE of a blackbody furnace 99 of the light receiving unit 50.

FIG. 10 is a diagram showing the relationship between the temperature TS of the light receiving unit 50 and the temperature TE of the blackbody furnace 99. The horizontal axis of FIG. 10 denotes the temperature TE of the blackbody furnace, while the vertical axis denotes the output signal VO outputted from the light receiving unit 50. FIG. 10 can be obtained, for example, from actual measurement with a following method.

More specifically, the light receiving unit 50 is placed in the oven. This makes the temperature of the light receiving unit 50 substantially the same as the temperature in the oven. The temperature of the oven (i.e., temperature TS of the light receiving unit 50) is then set to, for example, 0° C. After the temperature of the oven is stabilized at 0° C., the temperature TE of the blackbody furnace 99 is changed, and the output signal VO outputted from the light receiving unit 50 at the time is plotted. Similarly, the temperature of the oven is changed to, for example, 25° C. or 50° C. After the temperature of the oven is stabilized, the temperature TE of the furnace 99 is changed, and the output signal VO outputted from the light receipting unit 50 at the time is plotted. In FIG. 10, the output signal VO outputted when the temperature of the light receiving unit 50 is 25° C. and the temperature of the blackbody furnace 99 is 35° C. is standardized as the reference voltage (i.e. 1).

This enables plural curves to be obtained as shown in FIG. 10. As can be seen in FIG. 10, when the temperature of the blackbody furnace 99 is constant (for example, 35° C.), the output signal VO is dependent on the temperature TS of the light receiving unit 50. In this example, when the temperature TS of the light receiving unit 50 is in the range of 0° C. to 50° C., the absolute value of the output signal VO increases as the temperature TS decreases if the temperature TE of the blackbody furnace 99 is constant.

The curves shown in FIG. 10 are approximated, for example, by the least squares method as in equations (4) to (6).

$$VO|_{TS=0°C.} = 1.258 \times 10^{-5} TE^3 + 1.023 \times 10^{-3} TE^2 + 9.921 \times 10^{-2} TE - 6.056 \times 10^{-2} \quad (4)$$

$$VO|_{TS=25°C.} = 6.182 \times 10^{-6} TE^3 + 5.602 \times 10^{-4} TE^2 + 4.720 \times 10^{-2} TE - 1.633 \quad (5)$$

$$VO|_{TS=50°C.} = 2.743 \times 10^{-6} TE^3 + 3.757 \times 10^{-4} TE^2 + 1.167 \times 10^{-2} TE - 2.004 \quad (6)$$

$VO|_{TS=0°C.}$ denotes the output signal VO when the temperature TS of the light receiving unit 50 is 0° C., $VO|_{TS=25°C.}$ denotes the output signal VO when the temperature TS of the light receiving unit 50 is 25° C., and $VO|_{TS=50°C.}$ denotes the output signal VO when the temperature TS of the light receiving unit 50 is 50° C.

As can be seen from equations (4) to (6), the output signal VO, when the temperature is varied from 0 to 50° C. can be defined as shown in equation (7).

$$VO|_{TS} = A \times TE^3 + B \times 10^{-4} TE^2 + C \times TE + D \quad (7)$$

In equation (7), A, B, C, and D are constants dependent on the temperature TS of the light receiving unit 50.

4.4) Temperature Correction Method (Part 1)

Equations (3) to (6) (or equations (3), (7), and constants A to D corresponding to the temperature TS, i.e., correction coefficients) are stored in advance in the correction computing unit 40 when measuring the temperature of the object (a blackbody furnace is used in the experiment) using the infrared sensor. Equations (3) to (6) (or equations (3), (7), and constants A to D corresponding to the temperature TS are used every time the temperature of the object is measured. Equations (3) to (6) (or equations (3), (7), and constants A to D corresponding to the temperature TS) are output data and temperature data of the light receiving unit 50 and are preferably stored in the correction computing unit 40 or in a storage device (for example, optical disk or hard disk) connected to the correction computing unit 40 and arbitrarily read out during the computation process.

In the actual measurement, the absolute value of the voltage corresponding to the infrared energy will be measured by the voltmeter 37, and equations (3) to (6) (or equations (3), (7), and constants A to D corresponding to the temperature TS) can be used by converting the absolute value to the relative value based on the reference voltage (i.e., absolute value of the voltage measured when the temperature of the light receiving unit 50 is 25° C. and the temperature of the blackbody furnace 99 is 35° C.). The conversion of the absolute value to the relative value can be performed, for example, by using an operational function of the correction computing unit 40.

A correction method of the detected temperature in the infrared sensor 500 shown in FIG. 8 will be described based on the foregoing description.

In FIG. 8, the switching circuit 36 is operated by the correction computing unit 40. The resistance value of the light receiving unit 50 is measured by the measurement unit 35 when the light receiving unit 50 and the switching circuit 36 are connected by the terminal B, and the voltage signal VRO corresponding to the resistance value is outputted from the measurement unit 35 to the correction computing unit 40. For example, a certain current value is applied to the light receiving unit 50 from the measurement unit 35, and the voltage value proportional to the resistance of the light receiving unit 50 is measured by the measurement unit 35. The measurement obtained by the measurement unit 35 contains temperature information related to the light receiving unit 50, and the measurement containing the temperature information is outputted to the correction computing unit 40 as a voltage signal VRO in a form of, for example, a digital signal.

When the connection between the light receiving unit 50 and the switching circuit 36 is switched to the terminal A by a control signal S from the correction computing unit 40, the voltmeter 37 measures the absolute value of the voltage generated by photoelectric conversion of the infrared ray. The output signal VO is outputted from the voltmeter 37 to the correction computing unit 40 in a form of, for example, a digital signal.

Meanwhile the correction computing unit 40 assigns the voltage signal VRO in equation (3) and calculates the temperature TS of the light receiving unit 50. The correction computing unit 40 then selects a proper correction formula from equations (4) to (6) based on the calculated value of the temperature TS (or selects constants A to D corresponding to the temperature IS, assigns selected constants to equation (7), and then determines the correction formula). The correction computing unit 40 assigns a value of the output signal VO, transmitted from the voltmeter 37, to the selected (or determined) correction formula to thereby calculate the temperature TE of the object. The temperature TE is outputted outside the infrared sensor as an output signal VS.

As described, according to the fourth embodiment of the present invention, the infrared detectability of the light receiving units 10 and 50 is not affected by the heat energy of the light receiving units 10 and 50 or the heat energy on the periphery because the light receiving units 10 and 50 are quantum-type detector. Therefore, the light receiving units 10, 50 and the temperature measuring element 30 can be arranged on the identical substrate adjacent to each other, and the electrical signal converted by the light receiving unit 10 can be corrected with high accuracy.

Furthermore, as in the infrared sensor 500 shown in FIG. 7, the light receiving unit 50 can be constituted by photodiodes connected in series in multistage so that the light receiving unit 50 serves as the temperature measuring elements 30. Since the light receiving unit 50 is a temperature measuring element, the temperature of the light receiving unit 50 can be obtained more accurately. This enables to correct with high accuracy the electrical signal converted by the light receiving unit 50 and to output a highly accurate signal VS.

A case in which correction formulas are prepared by dividing the temperature TS of the light receiving unit into three temperature zones (0° C., 25° C., and 50° C.) has been described in the fourth embodiment. However, to more accurately correct the temperature, the temperature TS needs to be more finely divided and established, a multiplicity of approximate formulas (or constants A to D) corresponding to the established temperatures (hereinafter, also referred to as preset temperatures) TS need to be calculated in advance, and the calculated multiplicity of correction formulas need to be stored in the correction computing unit 40.

For example, the output signals VO are measured in advance with 1° C. intervals in the range of 0° C. to 50° C. (for example, the temperature of the light receiving unit TS=0, 1, 2, . . . , 50° C.). The approximate formulas (or constants A to D) are then respectively calculated in advance based on the measurement. With such a configuration, upon the temperature correction, the possibility to be able to select a suitable correction formula with a small gap between the actually measured temperature TS and the preset temperature becomes high. As a result, more accurate temperature correction can be performed.

When the value of the temperature TS calculated from equation (3) is far apart from the preset temperature TS of the approximate formula (i.e., the gap between the actually measured temperature TS and the preset temperature is large), the constants A to D may be estimated and used based on the nearest preset temperature TS. For example, if TS=1.5° C., approximated constants A to D can be used based on the constants A to D where TS=1° C. and constants A to D where TS=2° C.

As described, the correction computing unit 40 comprises: a storage function for storing the correlation between the output signal VO and the voltage signal VRO (for example, equations (3), (7), and constants A to D corresponding to the temperature TS) in the case where the temperature of the surrounding atmosphere of the temperature measuring element 30 is set up to a predetermined temperature and the temperature of the object (for example, blackbody furnace 99) is changed; an operational function for operating the optimal correction formula based on the correlation and the actually measured voltage signal VRO; and a calculation function for calculating the temperature of the object by applying the actually measured output signal VO to the optimal correction formula determined by the operation.

Although the correction computing unit 40 shown in FIG. 7 is designed to output the signal VS (voltage value of corrected VO) corresponding to the infrared radiation entered into the light receiving unit 50, the correction computing unit 40 may output the temperature (temperature information) TE instead of VS depending on the application.

FIG. 8 illustrates a case of obtaining the measurement related to the infrared energy and the measurement related to the temperature by measuring the electric potential at both ends of the infrared detection elements (photodiodes) that are connected in series and that constitute the light receiving unit 50. However, a certain current may be applied to an arbitrary section of the serial connection to observe a generated potential difference. For example, as for the measurement related to the infrared energy, data large in the signal strength may be obtained by measuring from the start point to the end point of the serial connection. Meanwhile, as for the measurement of the resistance related to the temperature, data may be obtained by observing up to an intermediate point of the serial connection, instead of from the start point to the end point (thus, only observing the section necessary to specify the temperature).

4.5) Method of Obtaining Correction Formula (Part 2)

In order to implement the measurement for obtaining the constants A, B, C, and D (i.e. correction coefficients) of equation (7), the temperature of the object (for example, blackbody furnace) has to be changed to measure the output signal VO. The light receiving unit 50 must be maintained at a constant temperature during the measurement.

Figure 11:
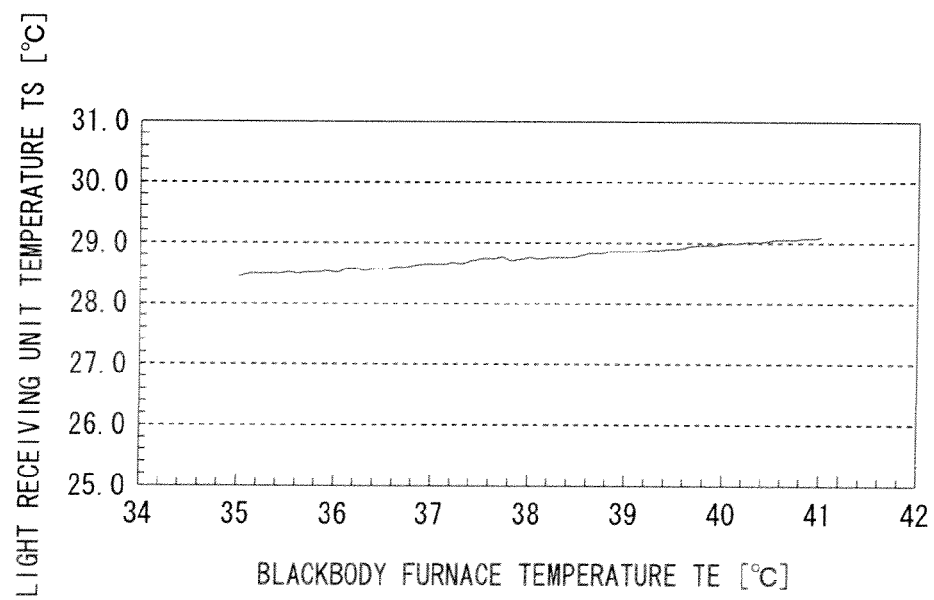
FIG. 11 is a diagram showing the relationship between the temperature TE and the temperature TS where the infrared sensor 500 is maintained at a constant temperature.

However, in the actual measurement, the light receiving unit 50 is often affected by the radiation from the object, and the temperature (although minor) is fluctuated. For example, FIG. 11 is a diagram showing the relationship between the temperature TE of the blackbody furnace 99 and the temperature TS of the light receiving unit 50 where the infrared sensor 500 is maintained at a constant temperature. The change in the temperature TS of the light receiving unit 50 is plotted in FIG. 11, in which the infrared sensor 500 is placed in an oven set up at 27° C. and the temperature is in a stable condition, and the output signal VO of the infrared sensor 500 is measured while changing the temperature TE of the blackbody furnace 99 from 35° C. to 41° C. The horizontal axis of FIG. 11 denotes the temperature TE of the blackbody furnace 99, while the vertical axis denotes the temperature TS of the light receiving unit 50. As shown in FIG. 11, with the rise in the temperature TE of the blackbody furnace 99, the temperature TS of the light receiving unit 50 slightly rises due to the radiation of the infrared ray.

As can be seen from the result, it is essential to measure the output signal VO while keeping the temperature of the light receiving unit 50 constant in order to truly accurately obtain the correction-coefficients of equation (7). To do so, the temperature setting of the oven must be adjusted every time the temperature of the blackbody furnace 99 is changed in order to control the temperature of the light receiving unit 50 to be always constant, and the measurement should not be performed until the temperature becomes stable. Even after the start of the measurement, the temperature of the oven must be frequently adjusted to prevent being affected by the radiation, which is cumbersome.

Therefore, a method will be described that is less cumbersome and that enables to accurately obtain the values of the correction coefficients even if the temperature of the light receiving unit 50 is fluctuated due to the radiation from the object when acquiring specific values of the correction coefficients.

First, in FIG. 8, the light receiving unit 50 of the infrared sensor 500 is placed in an oven whose temperature is maintained constant. The temperature of the blackbody furnace 99 is then changed to a desired measurement range (for example, 36° C. or more to 41° C. or less), and the output signal VO from the light receiving unit 50 and the resistance value of the light receiving unit 50 are measured. One measurement is performed after the entire measurement system has become steady. Next, the temperature of the light receiving unit 50 is calculated based on the measured resistance value using equation (3), and the result is plotted with the temperature TS of the light receiving unit 50 on the horizontal axis and the output signal VO on the vertical axis. Although the output signal VO is illustrated as a function of the temperature TE of the object in FIG. 10, the output signal VO is illustrated as a function of the temperature TS of the light receiving unit 63 herein.

Figure 12A:
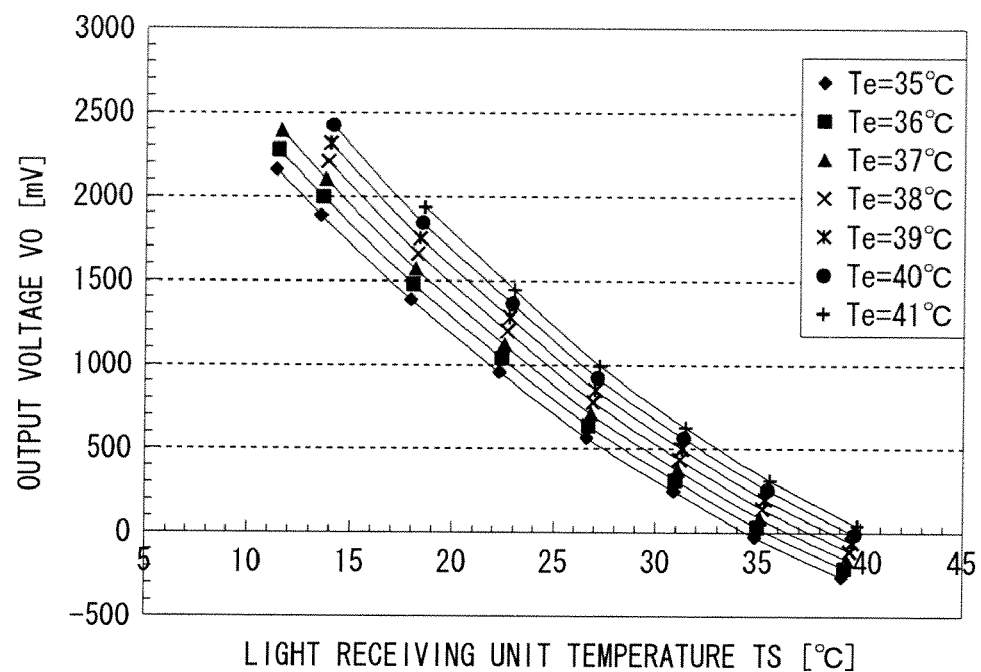
FIGS. 12A and 12B are the diagrams showing the relationship of the temperature TE to the temperature TS of the light receiving unit and an output voltage V0.

A plot of TS-VO is illustrated as an example in FIG. 12A in which the temperature TE of the blackbody furnace 99 is measured every 1° C. from 35° C. to 41° C. with the temperature of the light receiving unit 63 in the range of 10° C. to 40° C. Based on the plot, the relational expression of the temperature TS of the light receiving unit 50 and the output voltage V0 with respect to the temperature TE of the blackbody furnace 99 is calculated in advance using the least squares method. This enables to express the relationship between TS and VO by a quadratic function as in equation (8) and to obtain specific values of A0, A1, A2 corresponding to each temperature TE.

$$VO|_{TE} = A0 + A1 \times TS + A2 \times TS^2 \quad (8)$$

In equation (8), A0, A1, and A2 are constants dependent on the temperature TE of the object (for example, blackbody furnace 99). For example, the values of A0 to A2 when the temperature TE is 35° C. and the values of A0 to A2 when the temperature TE is 36° C. are different.

During such a measurement, the temperature of the blackbody furnace 99 can be easily maintained constant using a dedicated control source or the like. This is far easier as compared to the case in which the temperature of the oven is adjusted to maintain the temperature of the light receiving unit 50 constant.

4.6) Temperature Correction Method (Part 2)

When measuring the temperature of the object based on equation (8) or the like, equations (3), (8), and the coefficients A0 to A2 corresponding to each temperature TE are stored in advance, for example, in the correction computing unit 40 or in a storage device (for example, optical disk or hard disk) connected to the correction computing unit 40. The data is read out as necessary during the computation process.

Describing in detail, the light receiving unit 50 is first directed to the object to measure the output signal VO and the relative resistance RO. The value of the relative resistance RO is then assigned to equation (3) to calculate the temperature TS of the light receiving unit 50. As is clear from FIG. 12A, the output voltage V0 can be expressed with a function of the temperature TE of the object once the temperature TS is determined. More specifically, the output signal VO at the temperature TE (for example, every 1° C. in the range of 35° C. to 41° C.) of the object can be calculated using the calculated temperature TS and information of equation (8) and the correction coefficients A0 to A2.

Figure 12B:
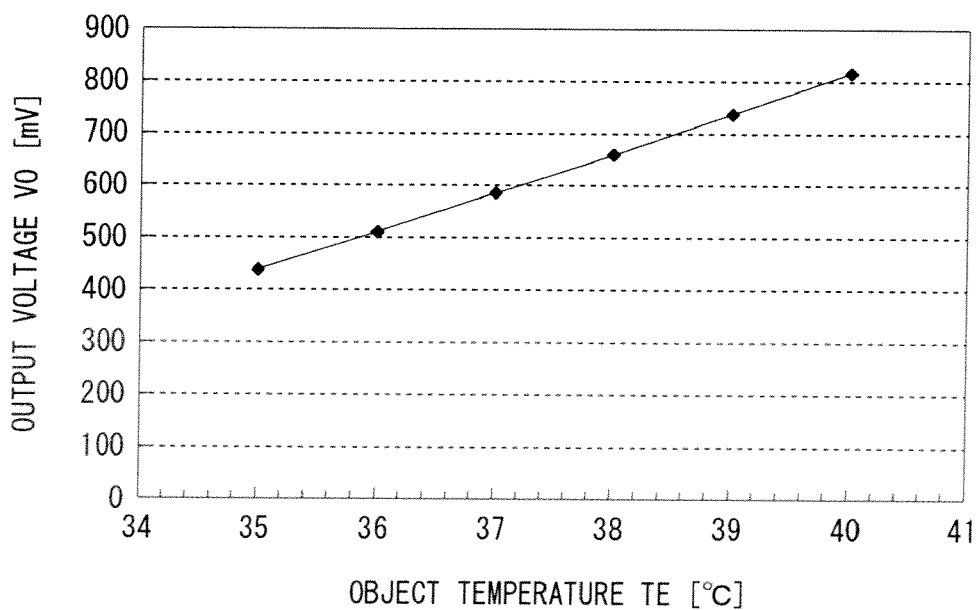

FIG. 12B depicts a plot in which the horizontal axis denotes the temperature TE of the object, while the vertical axis denotes the calculated value of the output signal VO. From this, the relational expression of the output signal VO and the temperature TE of the object is obtained using the least squares method. Equation (9) is provided as one example of the relational expression.

$$VO = -1021.3 + 8.713 TE + 0.967 TE^2 \quad (9)$$

The temperature TE of the object can be calculated from the output signal VO using equation (9).

As described, the correction computing unit 40 comprises: a storage function for storing the correlation between the output signal VO and the voltage signal VRO (for example, equations (3), (8), and constants A0 to A2 corresponding to the temperature TE) in the case where the temperature of the object (for example, blackbody furnace 99) is set up to a predetermined temperature and the temperature of the surrounding atmosphere of the temperature measuring element 30 is changed; an operational function for operating the optimal correction formula based on the correlation and the actually measured voltage signal VRO; and a calculation function for calculating the temperature of the object by applying the actually measured output signal VO to the optimal correction formula determined by the operation.

(5) Fifth Embodiment

The case of forming the quantum infrared detection element 11 and the temperature characteristic compensation element 21 on the identical substrate 1 has been described in the first and second embodiments. The case of forming the light receiving unit 10 including the quantum infrared detection element and the temperature measuring element 30 on the identical substrate 1 has been described in the fourth embodiment. However, the present invention may be configured by a combination of the first embodiment and the fourth embodiment, or a combination of the second embodiment and the fourth embodiment.

Figure 13A:
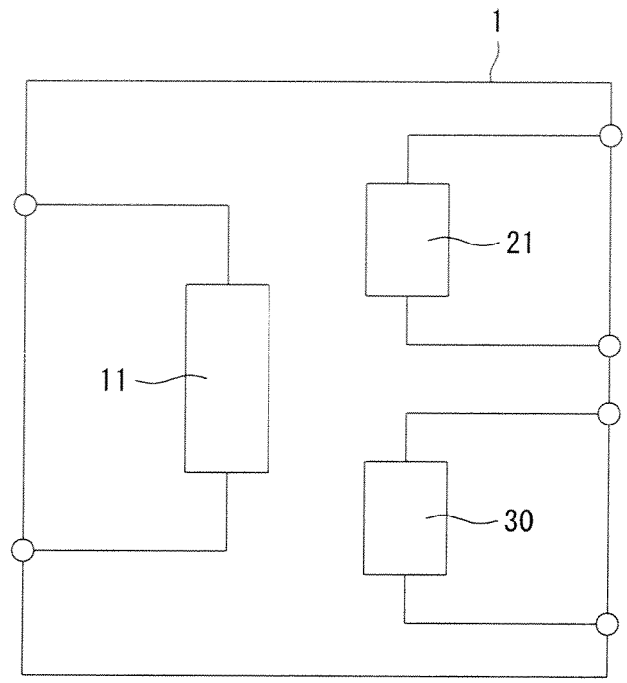
FIGS. 13A and 13B are the diagrams for a simple explanation of a fifth embodiment of the present invention.

More specifically, as shown in FIG. 13A, the infrared detection element 11 and the temperature characteristic compensation element 21 as well as the temperature measuring element 30 may be formed on the identical substrate 1. The light receiving unit 10 constructed by plural infrared detection elements 11 and the correction unit including both of the temperature characteristic compensation element 21 and the temperature measuring element 30 constitute one infrared sensor chip.

Figure 13B:
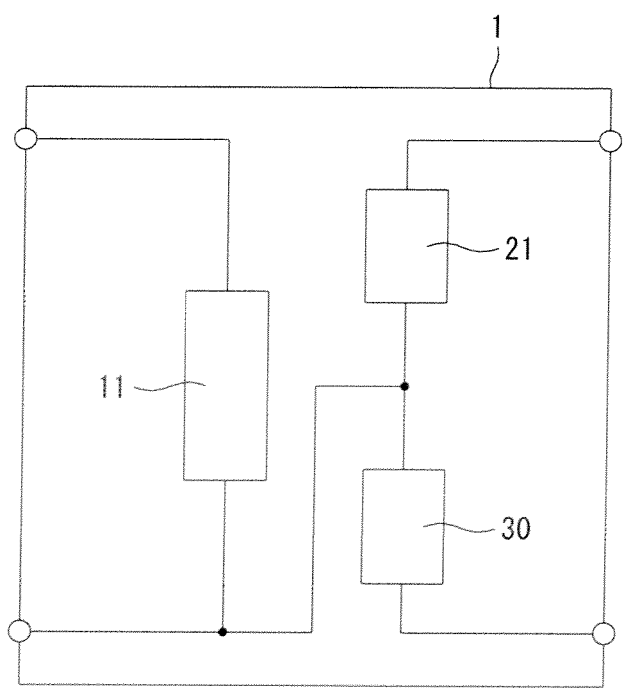

According to such a configuration, temperature data with higher accuracy can be provided because the output signal (output voltage) that is temperature-compensated by the temperature characteristic compensation element 21 can further be corrected based on the temperature of the infrared detection element 11. Such an example will be described in the fifth embodiment. FIG. 13A depicts a configuration in which all terminals (six in total) of the infrared detection element 11, the temperature characteristic compensation element 21, and the temperature measuring element 30 are drawn outside. However, as shown in FIG. 13B, the terminals of the infrared detection element 11, the temperature characteristic compensation element 21, and the temperature measuring element 30 may be connected within the substrate 1 to thereby constitute four terminals in total. With such a configuration, although the degree of freedom of wire connection is reduced, the number of terminals can be reduced. Therefore, the load of wiring or terminals can be reduced during the manufacture of elements. Furthermore, the number of wires and contact points can be reduced upon the installation of the elements of the present invention on a printed circuit board or other wiring boards so that the labor in the manufacture is simplified and facilitated. The configuration is also friendly to the natural environment because the materials for manufacturing can be reduced.

Figure 14:
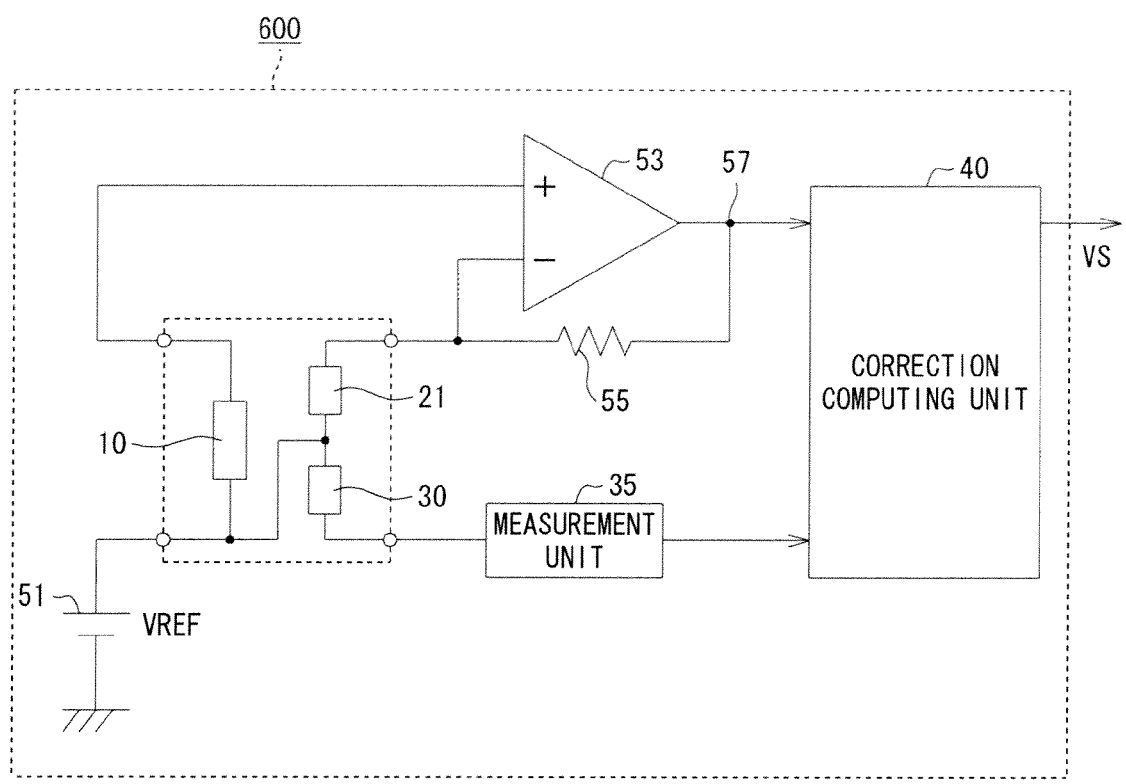
FIG. 14 is a schematic diagram showing a configuration example of an Infrared sensor 600 according to the fifth embodiment of the present Invention.

FIG. 14 is a schematic diagram showing a configuration example of an infrared sensor 600 according to the fifth embodiment of the present invention. In FIG. 14, like reference numerals are applied to parts having like configurations and like functions as in FIGS. 1 and 4 to 6, and the detailed description will not be repeated.

As shown in FIG. 14, the infrared sensor 600 comprises the substrate 1, the light receiving unit 10 including a quantum infrared detection element, a correction unit including both of the temperature characteristic compensation element 21 and the temperature measuring element 30, the measurement unit 35, the correction computing unit 40, the reference voltage generating circuit 51, the operational amplifier circuit 53, the resistive element 55, and the output terminal 57.

Figure 15A:
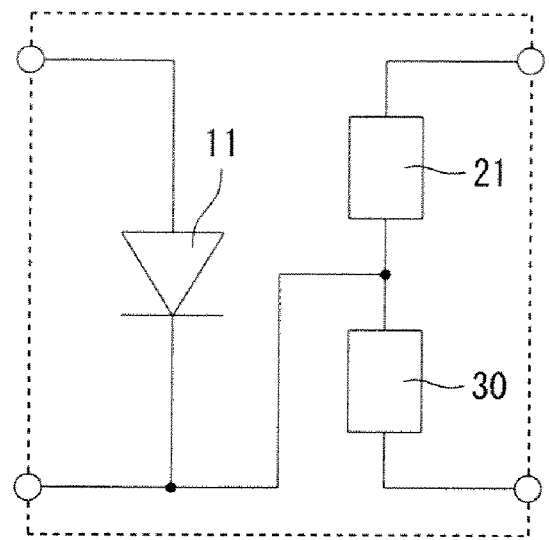
FIGS. 15A and 15B are the diagrams showing a configuration example of an infrared sensor chip included in the Infrared sensor 600.

As shown in FIG. 15A, the infrared detection element 11 included in the light receiving unit is, for example, a photodiode and is configured as shown in FIG. 2. Although only one photodiode is shown as the infrared detection element 11 in FIG. 15A, this is for preventing the complication of the drawing, and the number of the infrared detection element 11 is not limited to one. In the fifth embodiment too, the light receiving unit is constituted by, for example, plural infrared detection elements 11 connected in series in n stages, and the formation of the multistage serial connection leads to generation of a large output signal (voltage).

Figure 15B:
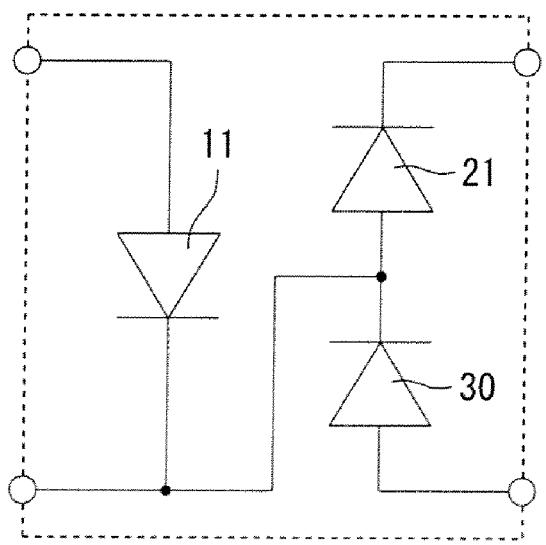

As shown in FIG. 15B, the temperature characteristic compensation element 21 also is, for example, a photodiode and configured as shown in FIG. 2. Although only one photodiode is shown as the temperature characteristic compensation element 21 in FIG. 15B, the number of the temperature characteristic compensation element 21 is not limited to one. The temperature characteristic compensation element 21 is constituted by, for example, one or m photodiodes connected in series. As shown in FIG. 15B, the temperature measuring element 30 also is, for example, a photodiode and configured as shown in FIG. 2. The number of photodiode that constitutes the temperature measuring element 30 is also not limited to one. The temperature measuring element 30 is constituted by, for example, photodiodes connected in series in multistage.

In the infrared sensor 600, the light receiving unit including the infrared detection element 11 and the temperature characteristic compensation element 21 as well as the temperature measuring element 30 are formed on the identical substrate 1. Specifically, the light receiving unit 10 shown in FIG. 14 and the correction unit Including the temperature characteristic compensation element 21 and the temperature measuring element 30 constitute one infrared sensor chip. The infrared detection element 11, the temperature characteristic compensation element 21, or the temperature measuring element 30 are formed of the identical material and have the identical configuration so that the infrared ray enters in the identical manner.

The connections in the infrared sensor 600 will now be described. As shown in FIG. 14 and FIG. 15B, the terminal on the cathode side of the light receiving unit 10 including the infrared detection element (for example, photodiode) 11 is connected to the reference voltage generating circuit 51, and the terminal on the anode side is connected to the non-inverting input terminal of the operational amplifier circuit 53. The terminal on the cathode side of the temperature characteristic compensation element (for example, photodiode) 21 is connected to the inverting input terminal of the operational amplifier circuit 53, and the terminal on the anode side of the temperature characteristic compensation element and the cathode side of the light receiving unit 10 are commonly connected to the reference voltage generating circuit 51. Furthermore, the terminal on the cathode side of the temperature measuring element (for example, photodiode) 30 and the cathode side of the light receiving unit 10 are commonly connected to the reference voltage generating circuit 51, and the terminal on the anode side is connected to the input terminal of the measurement unit 35.

As shown in FIG. 14, the resistive element 55 which is a feedback resistor is connected between the inverting input terminal of the operational amplifier circuit 53 and the output terminal 57. The output terminal 57 and the output terminal of the measurement unit 35 are connected to the correction computing unit 40.

In this way, according to the fifth embodiment of the present invention, the light receiving unit 10 and the temperature characteristic compensation element 21 as well as the temperature measuring element 30 are formed on the identical substrate 1. Therefore, all of the light receiving unit 10 and the temperature characteristic compensation element 21 as well as the temperature measuring element 30 can be placed under substantially identical environment. Furthermore, the output signal (i.e., signal outputted from the output terminal 57) that is temperature-compensated by the temperature characteristic compensation element 21 can be further corrected based on the temperature of the Infrared detection element 11. As a result, temperature data with accuracy higher than those in the embodiments 1 to 4 can be provided.

Figure 16A:
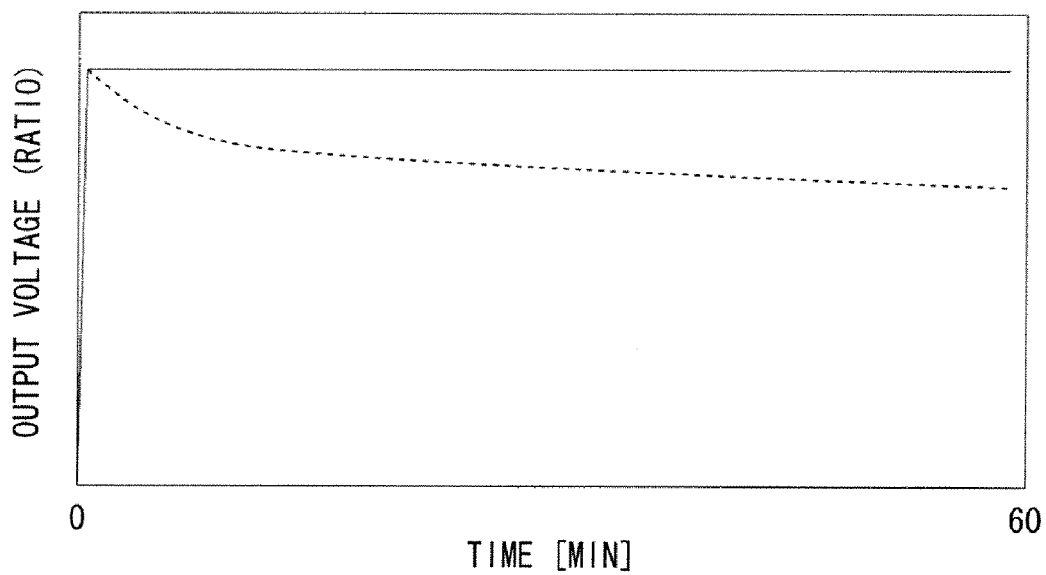
FIGS. 16A and 16B are the result diagrams of an experiment comparing the output voltage of the infrared sensor 600 and the output voltage of a conventional example.
Figure 16B:
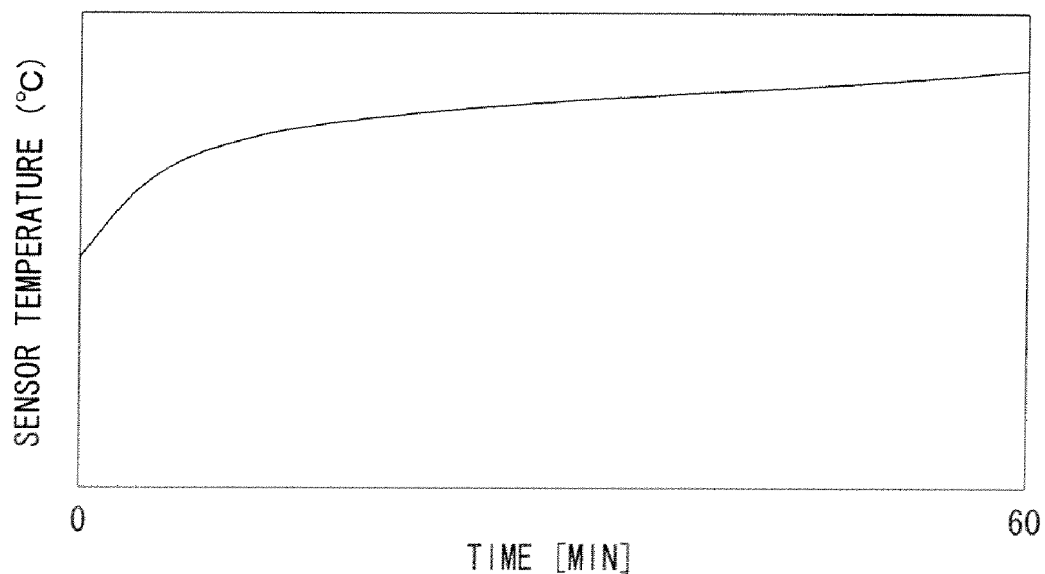

FIGS. 16A and 16B are diagrams showing the result of an experiment comparing the output signal (output voltage) VS of the infrared sensor 600 and the output voltage of a conventional example. The ambient temperature and the sensor temperature in this experiment is 25° C. The horizontal axes in FIGS. 16A and 16B denote time. The vertical axis in FIG. 16A denotes the voltage (sensor voltage) outputted from the Infrared sensor 600, while the vertical axis in FIG. 16B denotes the temperature of the light receiving unit 10. The solid line in FIG. 16A denotes the output signal (voltage) VS of the infrared sensor 600 according to the fourth embodiment, while the dotted line in FIG. 16A denotes the output signal VS of the conventional technique. As shown in FIG. 16B, when the infrared ray enters the light receiving unit 10, the internal temperature gradually rises over the course of time. In the conventional technique, the sensor voltage has been significantly decreasing along with such a temperature rise as shown with the dotted line in FIG. 16A. On the other hand, in the infrared sensor 600 of the present invention, the sensor voltage is substantially constant even when the internal temperature rises over the course of time.

In this way, according to the fifth embodiment of the present invention, it can be confirmed that a sensor voltage accurately reflecting the temperature of the object can be outputted with almost no influence of the internal temperature of the light receiving unit 10, as compared to the conventional technique.

(6) Sixth Embodiment

Figure 17A:
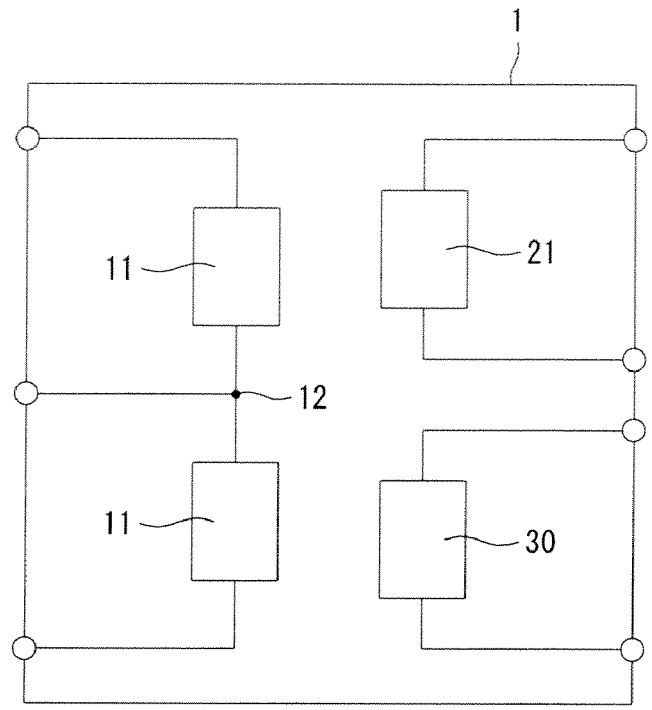
FIGS. 17A and 17B are the diagrams for a simple explanation of a sixth embodiment of the present invention.

A case in which the infrared detection element 11 and the temperature characteristic compensation element 21 as well as the temperature measuring element 30 are formed on the identical substrate 1 has been described in the sixth embodiment. However, in addition to such a configuration, the output signal of the infrared detection element 11 may be extracted as a differential output in the present invention. More specifically, as shown in FIG. 17A, the infrared detection element 11, the temperature characteristic compensation element 21, and the temperature measuring element 30 may be formed on the identical substrate 1, and the output of the infrared detection element 11 may be configured with three terminals of positive (+), negative (−), and a midpoint 12, thereby enabling to extract the output signal as a differential output. Amplification (i.e. differential amplification) of two output signals by the operational amplifier circuit enables to cancel the common-mode noise generated in the wiring in the light receiving unit or on the external lines, and to only amplify the signal components.

Figure 17B:
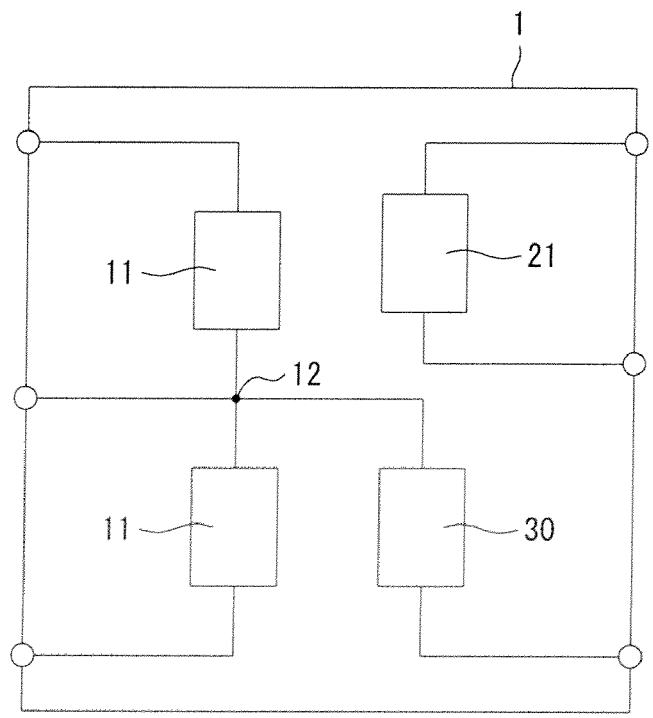

FIG. 17A depicts a configuration in which all terminals of the infrared detection element 11, the temperature characteristic compensation element 21, and the temperature measuring element 30, as well as the terminal connected to the midpoint 12 (seven terminals in total) are drawn outside. However, as shown in FIG. 17B for example, the midpoint 12 of the infrared detection element 11 and one terminal of the temperature measuring element 30 may be connected inside the substrate 1 to thereby constitute six terminals in total. With such a configuration, although the degree of freedom of wire connection decreases, the number of terminals can be reduced. Therefore, the load of wiring or terminals can be reduced during the manufacture of elements. Furthermore, the number of wires and contact points can be reduced upon the installation of the elements of the present invention on a printed circuit board or other wiring boards so that the labor in the manufacture is simplified and facilitated. The configuration is also friendly to the natural environment because the materials for manufacturing can be reduced.

Figure 18:
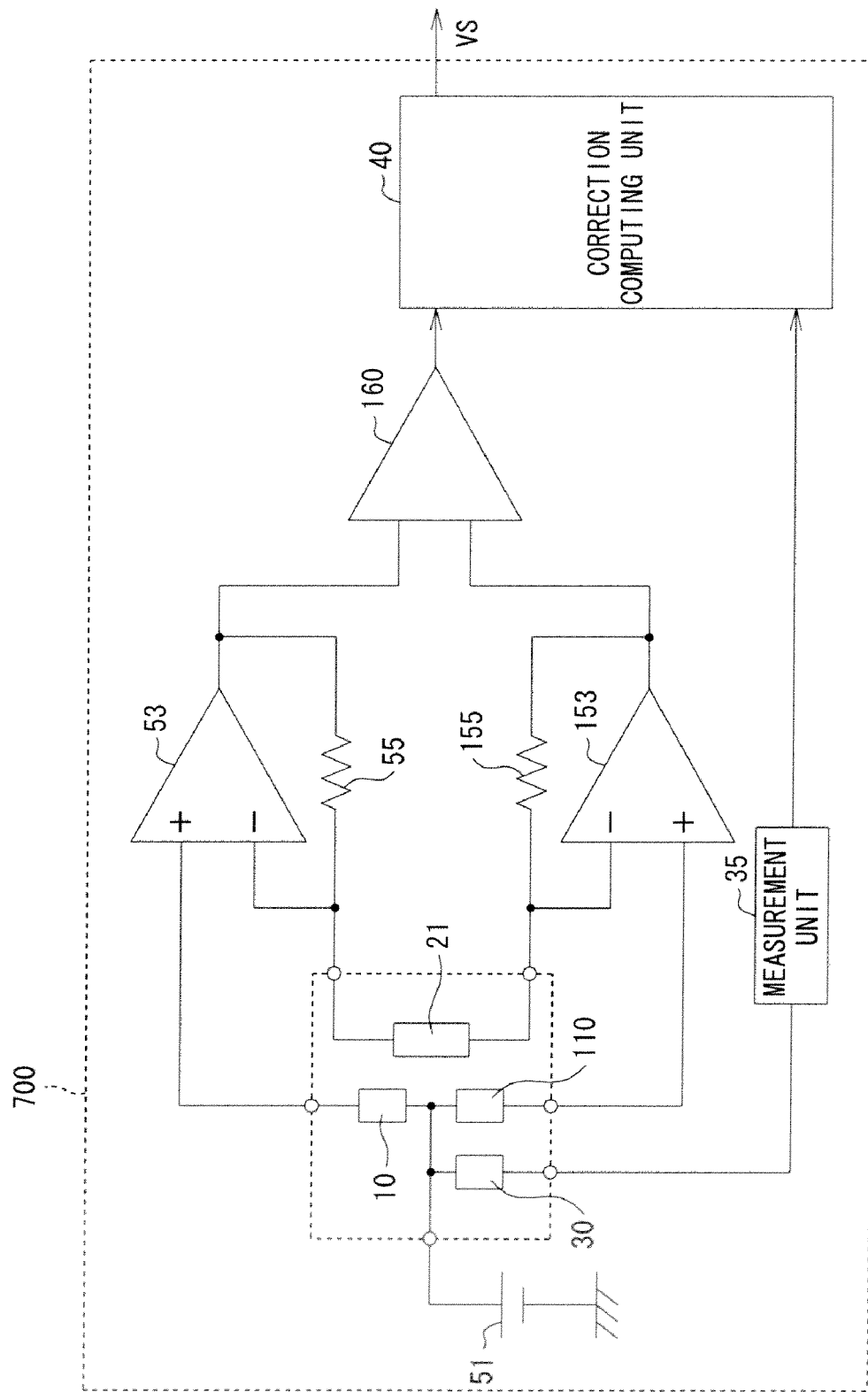
FIG. 18 is a schematic diagram showing a configuration example of an infrared sensor 700 according to the sixth embodiment of the present invention.

FIG. 18 is a schematic diagram showing a configuration example of an infrared sensor 700 according to the sixth embodiment of the present invention. In FIG. 18, like reference numerals are applied to parts having like configurations and like functions as in FIGS. 1, 4 to 6, and 13, and the detailed description will not be repeated.

As shown in FIG. 18, the Infrared sensor 700 comprises the substrate 1, the first light receiving unit 10 including a quantum infrared detection element, a second light receiving unit 110 including a quantum infrared detection element, a correction unit including both of the temperature characteristic compensation element 21 and the temperature measuring element 30, the measurement unit 35, the correction computing unit 40, the reference voltage generating circuit 51, the first operational amplifier circuit 53, a second operational amplifier circuit 153, the first resistive element 55, a second resistive element 155, the first output terminal 57, a second output terminal 157, and a third operational amplifier circuit 160.

Among these, each of the light receiving units 10 and 110 is constituted by infrared detection elements connected in series in n stages. The light receiving units 10 and 110 are formed of the identical material and have the identical configuration so that the infrared ray enters in the identical manner. In the infrared sensor 700, the two light receiving units 10, 110, and the temperature characteristic compensation element 21 as well as the temperature measuring element 30 are formed on the identical substrate 1. The light receiving units 10, 110, and the temperature characteristic compensation element 21 as well as the temperature measuring element 30 constitute one infrared sensor chip.

Figure 19A:
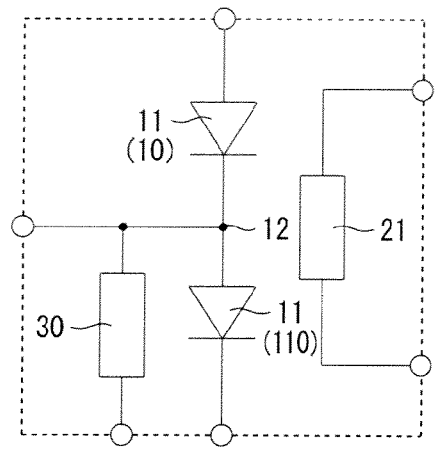
FIGS. 19A, 19B and 19C are the diagrams showing the configuration examples of an infrared sensor chip included in the infrared sensor 700.

As shown in FIG. 19A, the infrared detection element 11 included in each of the first and second light receiving units is, for example, a photodiode and configured, for example, as shown in FIG. 2. Although only one photodiode each is shown as the infrared detection element 11 included in each of the first and second light receiving units in FIG. 19A, this is for preventing the complication of the drawing, and the number of the infrared detection element 11 is not limited to one for each. Each of the first and second light receiving units is constituted by plural infrared detection elements 11 connected in series in n stages and is designed to generate a large output signal (voltage) with the multistage series.

Figure 19B:
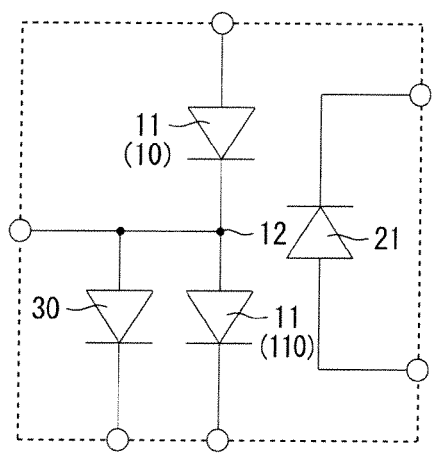

As shown in FIG. 19B, the temperature characteristic compensation element 21 and the temperature measuring element 30 are also, for example, photodiodes and configured as shown in FIG. 2. The temperature characteristic compensation element 21 and the temperature measuring element 30 are constituted by, for example, photodiodes connected in series in multiple stages. The infrared detection element 11, the temperature characteristic compensation element 21, or the temperature measuring element 30 are formed of the identical material on the identical substrate and have the identical configuration so that the Infrared ray enters in the identical manner.

The connections in the infrared sensor 700 will now be described. As shown in FIG. 18 and FIG. 19B, the terminal on the cathode side of the first light receiving unit 10 including the infrared detection element (for example, photodiode) 11 is connected to the reference voltage generating circuit 51, the terminal on the anode side is connected to the non-inverting input terminal of the first operational amplifier circuit 53. The terminal on the cathode side of the second light receiving unit 110 including the infrared detection element (for example, photodiode) 11 is connected to the inverting input terminal of the second operational amplifier circuit 153, and the terminal on the anode side is connected to the reference voltage generating circuit 51. Furthermore, the terminal on the cathode side of the temperature characteristic compensation element (for example, photodiode) 21 is connected to the inverting input terminal of the operational amplifier circuit 53, and the terminal on the anode side is connected to the inverting input terminal of the operational amplifier circuit 153. The terminal on the cathode side of the temperature measuring element (for example, photodiode) 30 is connected to the input terminal of the measurement unit 35, and the terminal on the anode side is connected to the reference voltage generating circuit 51. Thus, the terminal on the cathode side of the light receiving unit 10, the terminal on the anode side of the light receiving unit 110, and the terminal on the anode side of the temperature measuring element 30 are commonly connected to the reference voltage generating circuit 51.

With such a connection, the polarity of a first output signal outputted from the light receiving unit 10 and the polarity of a second output signal outputted from the light receiving unit 110 oppose each other. The first output signal is non-inversely amplified by the operational amplifier circuit 53, while the second output signal is non-inversely amplified by the operational amplifier circuit 153.

As shown in FIG. 18, the resistive element 55, which is a feedback resistor, is connected between the non-inverting input terminal and the output terminal 57 of the operational amplifier circuit 53, and the resistive element 155, which is a feedback resistor is connected between the inverting input terminal and the output terminal 157 of the operational amplifier circuit 153. One input terminal (for example, inverting input terminal) of the operational amplifier circuit 160 is connected to the output terminal 57, while the other input terminal (for example, non-inverting input terminal) is connected to the output terminal 157. The output terminal of the third operational amplifier circuit 160 and the output terminal of the measurement unit 35 are connected to the correction computing unit 40.

With such a connection, the output signal of the first operational amplifier circuit 53 and the output signal of the second operational amplifier circuit 153 are differentially outputted by the operational amplifier circuit 160. In other words, the first and second output signals are respectively amplified by two identical operational amplifier circuits 53 and 153 in the first half of the circuit, and the amplified output signals are subtracted by the operational amplifier circuit 160 in the second half of the circuit. This enables to cancel the common-mode noise generated in the wiring in the light receiving units 10 and 110 or on the external lines, and to only amplify the signal components. The signals differentially-outputted by the operational amplifier circuit 160 is inputted to the correction computing unit 40. The values are corrected based on the signal outputted from the measurement unit 35, and the output signal VS is outputted outside the infrared sensor 700.

According to the sixth embodiment of the present invention, as in the fifth embodiment, the infrared detection element 11 and the temperature characteristic compensation element 21 as well as the temperature measuring element 30 are formed of the identical material on the identical substrate 1 and have the Identical configuration so that the infrared ray enters in the Identical manner. As a result, all of the light receiving unit 10, the temperature characteristic compensation element 21 as well as the temperature measuring element 30 can be placed under the environment of a substantially identical temperature, and the output signal temperature-compensated by the temperature characteristic compensation element 21 can be further corrected based on the temperature of the infrared detection element 11. Furthermore, according to the sixth embodiment, the temperature-compensated first and second output signals are differentially outputted, and thus, the common-mode noise generated in or out of the light receiving units 10 and 110 can be reduced. This enables the provision of temperature data with high accuracy.

Figure 19C:
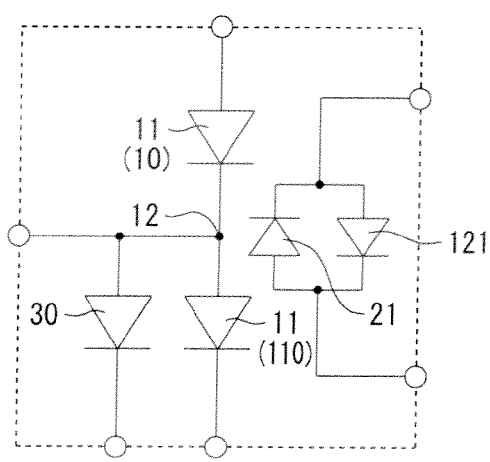

In the infrared sensor 700, the temperature characteristic compensation elements may be place in parallel in the opposite directions as shown in FIG. 19C. More specifically, the first temperature characteristic compensation element (for example, photodiode) 21 and a second temperature characteristic compensation element (for example, photodiode) 121 may be prepared, the cathode of the first temperature characteristic compensation element 21 and the anode of the second temperature characteristic compensation element 121 may be commonly connected to the non-inverting input terminal of the operational amplifier circuit 53 (refer to FIG. 18), and the anode of the first temperature characteristic compensation element 21 and the cathode of the second temperature characteristic compensation element 121 may be commonly connected to the inverting input terminal of the operational amplifier circuit 153 (refer to FIG. 18). Such a configuration enables to eliminate the directionality of diode from the temperature characteristic compensation elements.

(7) Seventh Embodiment

A thermometer (for example, body thermometer) applying the infrared sensor of the present invention will now be described.

Figure 21:
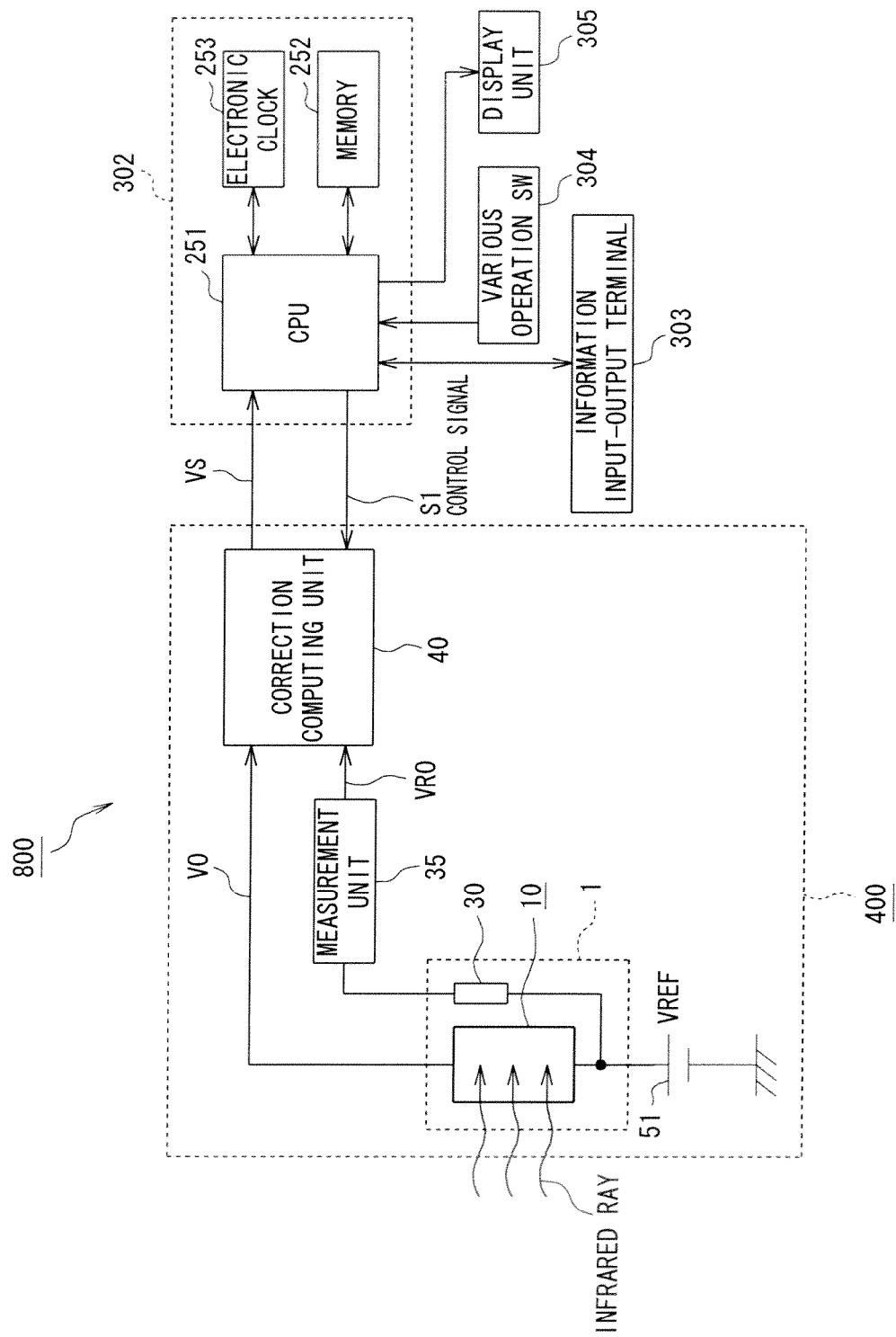
FIG. 21 is a schematic diagram showing a configuration example of the in-ear thermometer 800.
Figure 23:
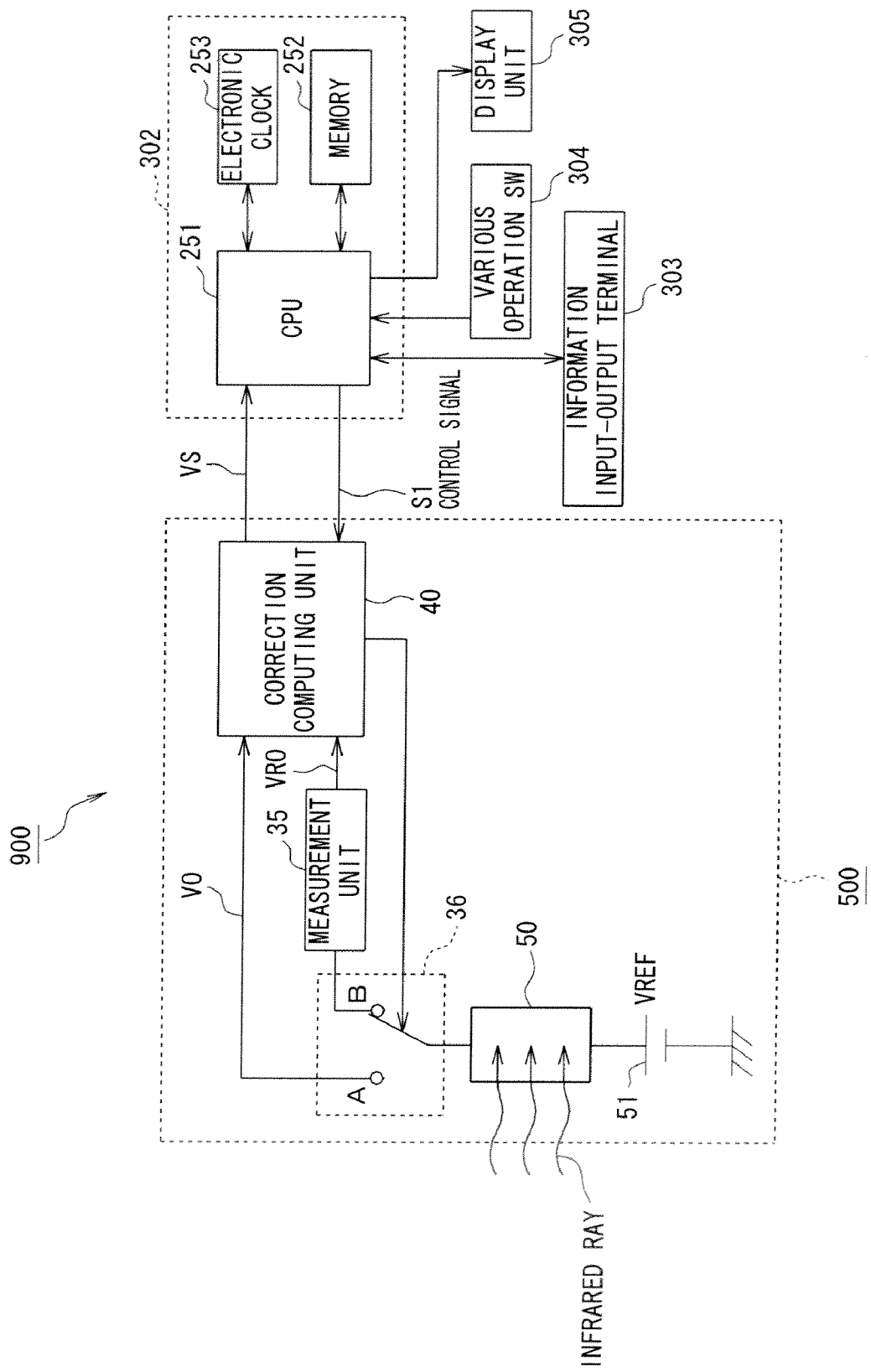
FIG. 23 is a diagram showing a configuration example of an in-ear thermometer 900 according to the seventh embodiment of the present invention.

FIG. 20 is a schematic diagram showing a configuration example of an in-ear thermometer 800 according to a seventh embodiment of the present invention. In FIGS. 20, 21, and 23, like reference numerals are applied to parts having like configurations and like functions as in FIGS. 1, 4 to 7, 14, and 18, and the detailed description will not be repeated.

As shown in FIG. 20, the in-ear thermometer 800 is configured by including the infrared sensor 400, a processing unit 302, an information input-output terminal 303, various operation switches 304, a display unit 305, and a case 306 that houses these parts inside. As shown in FIG. 1, the processing unit 302 is electrically connected through wiring to the infrared sensor 400, the information input-output terminal 303, the various operation switches 304, and the display unit 305.

As shown in FIG. 21, the infrared sensor 400 is configured by including the substrate 1, the light receiving unit 10, the temperature measuring element 30, the measurement unit 35, the correction computing unit 40, and the reference voltage generating circuit 51. As described, the light receiving unit 10 is constituted by infrared detection elements (for example, photodiodes) connected in series in n stages, and the specific configuration is, for example, as shown in FIG. 21. The temperature measuring element 30 also has, for example, the identical configuration as the light receiving unit 10 and is constructed by infrared detection elements made of the identical material. The light receiving unit 10 and the temperature measuring element 30 are formed on the identical substrate 1.

Furthermore, correction formulas and the like for correcting the output signal VO based on the voltage signal VRO are stored in the correction computing unit 40. The method of obtaining the correction formulas and the correction method of the output signal VO are as described in 4.3) to 4.6) of the fourth embodiment.

As shown in FIG. 21, in the in-ear thermometer 800, the signal VS outputted from the correction computing unit 40 of the infrared sensor 400 is transmitted to the processing unit 302. The processing unit 302 is a part that processes the signal VS outputted from the infrared sensor 400 and is configured by including a CPU 251, a memory 252, an electronic clock 253, and the like. The CPU 251 includes functions for processing a digitalized signal, for storing information in the memory 252, and for causing the information input-output terminal 303 to output the information stored in the memory 252. The display unit 305 connected to the CPU 251 can display various measurement conditions such as a temperature measured by the infrared sensor 400, time of measurement, available memory of the memory 252, measurement start time, and measurement end time.

As shown in FIG. 21, the various operation switches (SW) 304 such as a power switch, a switch for controlling start and end of the measurement of body temperature, a switch for changing the interval of measurement are connected to the CPU 251 of the processing unit 302. The information input-output terminal 303 is also connected to the processing unit 302. The information input-output terminal 303 can output the change of body temperature during an interval of time, or control information that are stored in a memory stored in a processing unit of the processing unit 302 to an external Information processing terminal such as a personal computer and a PDA, and can also input a dedicated program based signal from an external information processing terminal such as a personal computer and a PDA to the CPU 251 of the processing unit 302.

The information input-output terminal 303 enables connection to an external information processing terminal. The CPU 251 can cause the correction computing unit 40 to execute an appropriate process by sending a control signal (for example, S1) to the infrared sensor 400. The CPU 251 can also make changes to the power on/off, measurement start time and measurement end time, interval of measurement, measurement accuracy, or the like in accordance with instruction information inputted from the various operation switches 304.

The correction computing unit 40 of the infrared sensor 400 can also be incorporated into the CPU 251 of the processing unit 302. This enables to reduce the components, thereby allowing miniaturization and downsizing. In that case, VO and VRO are directly transmitted to the processing unit 302, and the CPU 251 can execute processes synonymous with the correction computing unit 40. If VO and VRO are analog signals, the CPU 251 converts the signals to digital signals and then executes computation, judgment processing, or the like. The memory 252, the electronic clock 253, and the like may be installed in the CPU 251 or constructed in a program of the CPU 251 as long as the functions are not impaired.

Figure 22:
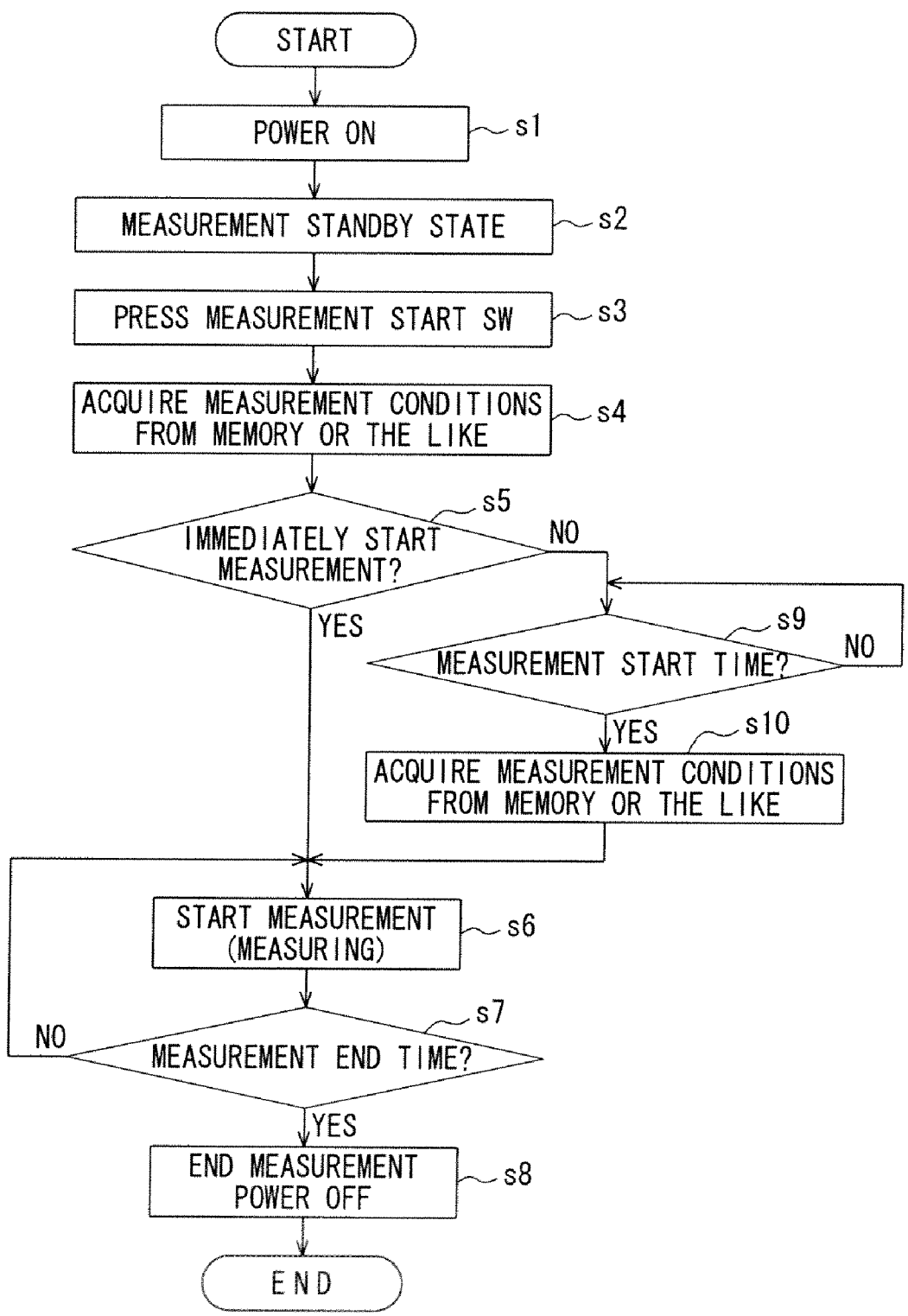
FIG. 22 is a flow chart showing a procedure of body temperature measurement by the in-ear thermometer 800.

A procedure of body temperature measurement by the in-ear thermometer 800 will now be described with reference to FIG. 22. The power is first turned on using the various operation switches 304 (step s1). This sets up a standby state (step s2). When a measurement start switch of the various operation switches 304 is pressed in this state (step s3), the CPU 251 of the processing unit 302 transmits a control signal (S1 or the like) of measurement start to the correction computing unit 40 of the infrared sensor 400, thereby enabling to start the measurement. In the standby state, information of measurement conditions and the like described below is acquired from an external information processing terminal having a program that can establish automatic measurement conditions (step s4). The information can also be acquired from input from the information input-output terminal 303 and the various operation switches 304.

The measurement conditions herein refer to information for recording and controlling the measurement start time, the measurement end time, the measurement accuracy, the measurement time interval, and the like. The information can be stored in the memory 252 of the processing unit 302 or can be stored in advance in a modifiable nonvolatile memory. Measurement data can be transmitted to an external Information terminal by connecting the information input-output terminal 303 to the external information processing terminal.

Whether the CPU 251 of the processing unit 302 starts the measurement is then determined (step s5), and when the measurement is to be started, the CPU 251 transmits a control signal to the infrared sensor 400 to start measuring the temperature (step s6). The output signal VS from the infrared sensor 400 is digitally converted by an AD converter of the processing unit 302 and transmitted to the CPU 251. The CPU 251 stores the output signal along with the measured time in a memory in accordance with the preset measurement conditions.

In this case, device information such as measurement data and available memory are displayed on the display unit 305 as necessary. The device can also start or stop the measurement, record in a memory in a certain recording cycle, or change the recording cycle or accuracy in accordance with the preset measurement conditions. In that case, the CPU can automatically turn on the power at the measurement start time and turn off the power if not necessary. The CPU can further stop the measurement at the measurement end time and turn off the power while retaining the information recorded in the memory. The recorded information can be outputted through the information input-output terminal 303 (step s7 to s10). As described, according to the seventh embodiment of the present invention, the infrared detectability is not affected by the heat energy of the light receiving unit 10 or the heat energy on the periphery because the light receiving unit 10 is a quantum-type detector. Therefore, the light receiving unit 10 and the temperature measuring element 30 can be arranged on the identical substrate 1 adjacent to each other, and the electrical signal converted by the light receiving unit 10 can be more corrected with high accuracy. This enables to consecutively, without contact, measure the body temperature of human body, and consecutively measure, with only minor errors, the changes in the body temperature, basal body temperature, and body temperature during sleep that are important for the detection of disease in human body, the management of body temperature during operation, feminine disorders, and birth control. Moreover, an ultra-small element can be constructed to reduce the burden on the patient.

In the seventh embodiment, although the case in which the infrared sensor 400 described in the fourth embodiment is applied to a thermometer (for example, body thermometer) has been described, the infrared sensor 400 applicable to a thermometer is never limited to this. All infrared sensors described in the first to fourth embodiments of the present invention can also be applied to the thermometer.

For example, as shown in FIG. 23, the infrared sensor 500, the processing unit 302, the Information input-output terminal 303, the various operation switches 304, the display unit 305, and the case 306 that are described in the fourth embodiment may be combined to constitute an in-ear thermometer 900. In FIG. 23, like reference numerals are applied to parts having like configurations and like functions as in FIG. 7 and FIG. 21, and the detailed description will not be repeated. With such a configuration, the light receiving unit 50 also serves as a temperature measuring element, and thus, the temperature of the light receiving unit 50 can be FIGured out more accurately, and the electrical signal converted by the light receiving unit 50 can be corrected with higher accuracy. As a result, temperature data can be provided with further fewer errors. Although cases in which the reference voltage generating circuit is installed in the infrared sensor and the reference voltage VREF is applied to the temperature characteristic compensation element has been described in the first to sixth embodiments, the reference voltage VREF may be, for example, 0V (i.e., ground potential). Alternatively, the reference voltage generating circuit itself may be eliminated, and the light receiving unit and the temperature characteristic compensation element may be directly connected to the ground terminal. With such a configuration, for example, although adjustment or the like of the input offset voltage of the operational amplifier circuit will be difficult, the circuit configuration will be simplified on the other hand. Therefore, the load of wiring or terminals can be reduced during the manufacture of elements. Furthermore, the number of wires and contact points can be reduced upon the installation of the elements of the present invention on a printed circuit board or other wiring boards so that the labor in the manufacture is simplified and facilitated. The configuration is also friendly to the natural environment because the materials for manufacturing can be reduced.

The infrared sensor of the present invention can detect an infrared ray emitted from human body as well. Therefore, the infrared sensor can also be used as a human detection sensor that detects human body, based on voltage signals, by comparing electrical signals, fluctuations, or waveforms of voltage outputs or the like in the cases where a human body does not exist and where a human body exists. The first to sixth embodiments of the present invention can be applied to the sensors, thereby enabling to particularly correct electrical signals even when the temperature of the infrared sensor element is fluctuated, and to detect human body more precisely. Particularly, the infrared sensor can detect human body and the like with higher accuracy by incorporating a determination mechanism of human body detection into the temperature computing unit in the fourth to sixth embodiments. The infrared sensor can be suitably used as a human detection sensor in household appliances and house hold equipment such as for crime prevention, illumination, and air conditions, or in commercial applications.

In FIGS. 1, 4, 5, 14, and 18, the correction unit 20 or the light receiving unit 10 may be connected in the opposite direction, or both of the light receiving unit 10 and the correction unit 20 may be connected in the opposite directions. The subsequent circuit processing by the operational amplifier circuit 53 may be facilitated when the light receiving unit 10 is connected in the opposite direction.

The correction unit 20 may be regarded as a resistance when the current flowing through the correction unit 20 is low, and the same temperature information can be obtained regardless of the direction of the current flow. Therefore, the correction unit 20 can be connected in either direction. However, if the gain of the operational amplifier circuit 53 and the operational amplifier circuit 153 is high (when the resistive elements 55 and 155 are large) in FIGS. 1, 5, 14, and 18, the output voltage becomes high, and the voltage imposed on the diode of the correction unit 20 also increases. In this case, it may be preferable that flows in the reverse direction of the diode so that the power consumption of the entire circuit is reduced.

The invention claimed is:

1. An infrared sensor that converts energy of an infrared ray radiated from an object to an electrical signal and that outputs the electrical signal, the infrared sensor characterized by comprising:
   a light receiving unit that includes a quantum infrared detection element and that converts the energy of the infrared ray to the electrical signal; and
   a correction unit that corrects a first output signal from the light receiving unit,
   wherein the light receiving unit and the correction unit are formed of an identical material on an identical substrate and have an identical configuration so that the infrared ray enters the light receiving unit and the correction unit in an identical manner.

2. The infrared sensor according to claim 1, characterized in that the light receiving unit comprises a plurality of the infrared detection elements connected in series in a plurality of stages.

3. The infrared sensor according to claim 1, characterized in that the correction unit comprises a temperature characteristic compensation element that compensates a temperature characteristic of the first output signal from the light receiving unit.

4. The infrared sensor according to claim 3, characterized in that:
   the correction unit comprises a plurality of the temperature characteristic compensation elements connected in series in a plurality of stages; and
   a second output signal for temperature characteristic compensation is extracted from an arbitrary connection point of the plurality of temperature characteristic compensation elements connected in series.

5. The infrared sensor according to claim 3 or claim 4, characterized by comprising:
   an operational amplifier circuit that amplifies the first output signal from the light receiving unit;
   a resistive element connected between an inverting input terminal and an output terminal of the operational amplifier circuit; and
   a reference voltage generating circuit that generates a reference voltage,
   wherein a first terminal of the light receiving unit is connected to an non-inverting input terminal of the operational amplifier circuit, a first terminal of the temperature characteristic compensation element is connected to the inverting input terminal of the operational amplifier circuit, and a second terminal of the light receiving unit and a second terminal of the temperature characteristic compensation element are commonly connected to the reference voltage generating circuit.

6. The infrared sensor according to claim 5, characterized in that:
   the infrared detection element included in the light receiving unit is made of the first photodiode;
   the temperature characteristic compensation element is made of the second photodiode;
   the first photodiode and the second photodiode are formed of an identical material on an identical substrate and have an identical configuration so that the infrared ray enters in an identical manner;
   the first terminal of the light receiving unit is the anode terminal of the first photodiode;
   the second terminal of the light receiving unit is the cathode terminal of the first photodiode;
   the first terminal of the temperature characteristic compensation element is the cathode terminal of the second photodiode, and
   the second terminal of the temperature characteristic compensation element is the anode terminal of the second photodiode.

7. The infrared sensor according to claim 3 or claim 4, characterized by comprising:
   a current source that supplies a current to the temperature characteristic compensation element;
   a comparator circuit that compares the first output signal from the light receiving unit with the second output signal from the temperature characteristic compensation element; and
   a reference voltage generating circuit that generates a reference voltage,
   wherein a first terminal of the light receiving unit is connected to a first input terminal of the comparator circuit, a first terminal of the temperature characteristic compensation element and a first terminal of the current source are connected to a second input terminal of the comparator circuit, a second terminal of the light receiving unit and a second terminal of the temperature characteristic compensation element, and a second terminal of the current source are commonly connected to the reference voltage generating circuit.

8. The infrared sensor according to claim 3 or claim 4, characterized by comprising:
   a voltage follower circuit that buffers the first output signal from the light receiving unit;
   an operational amplifier circuit in which a first terminal of the temperature characteristic compensation element is connected to an inverting input terminal;
   a resistive element connected between the inverting input terminal and an output terminal of the operational amplifier circuit; and
   a reference voltage generating circuit that is connected to an non-inverting input terminal of the operational amplifier circuit and that generates a reference voltage,
   wherein an output terminal of the voltage follower circuit and a second terminal of the temperature characteristic compensation element are connected.

9. The infrared sensor according to claim 3 or claim 4, characterized in that the light receiving unit comprises:
   a first light receiving unit;
   a second light receiving unit that outputs a second output signal having a polarity opposite to a first output signal outputted from the first light receiving unit;
   a first operational amplifier circuit that amplifies the first output signal from the first light receiving unit;
   a second operational amplifier circuit that amplifies the second output signal from the second light receiving unit;
   a third operational amplifier circuit that amplifies a signal outputted from the first operational amplifier circuit and a signal outputted from the second operational amplifier circuit;

a first resistive element connected between an inverting input terminal and an output terminal of the first operational amplifier circuit;

a second resistive element connected between an inverting input terminal and an output terminal of the second operational amplifier circuit; and a reference voltage generating circuit that generates a reference voltage, wherein:

a first terminal of the first light receiving unit is connected to an non-inverting input terminal of the first operational amplifier circuit, a first terminal of the temperature characteristic compensation element is connected to the non-inverting input terminal of the first operational amplifier circuit, a second terminal of the first light receiving unit is connected to the reference voltage generating circuit; and a first terminal of the second light receiving unit is connected to an inverting input terminal of the second operational amplifier circuit, a second terminal of the temperature characteristic compensation element is connected to the inverting input terminal of the second operational amplifier circuit, and a second terminal of the second light receiving unit is connected to the reference voltage generating circuit.

10. The infrared sensor according to claim 9, characterized in that:

each of a first infrared detection element included in the first light receiving unit and a second infrared detection element included in the second light receiving unit is made of a first photodiode;

the temperature characteristic compensation element is made of a second photodiode;

the first photodiode and the second photodiode are formed of an identical material on an identical substrate and have an identical configuration so that the infrared ray enters in an identical manner;

the anode terminal of the first photodiode that constitutes the first infrared detection element is connected to the non-inverting input terminal of the first operational amplifier circuit, while the cathode terminal of the first photodiode is connected to the reference voltage generating circuit;

the cathode terminal of the first photodiode that constitutes the second infrared detection element is connected to the non-inverting input terminal of the second operational amplifier circuit, while the anode terminal of the first photodiode is connected to the reference voltage generating circuit; and the cathode terminal of the second photodiode that constitutes the temperature characteristic compensation element is connected to the inverting input terminal of the first operational amplifier circuit, while the anode terminal of the second photodiode is connected to the inverting input terminal of the second operational amplifier circuit.

11. The infrared sensor according to claim 10, characterized in that:

the correction unit comprises a plurality of the temperature characteristic compensation elements;

the cathode terminal of the second photodiode that constitutes a first temperature characteristic compensation element is connected to the inverting input terminal of the first operational amplifier circuit, while the anode terminal of the second photodiode is connected to the inverting input terminal of the second operational amplifier circuit; and the cathode terminal of the second photodiode that constitutes a second temperature characteristic compensation element is connected to the inverting input terminal of the second operational amplifier circuit, while the anode terminal of the second photodiode is connected to the inverting input terminal of the first operational amplifier circuit.

12. The infrared sensor according to claim 3, characterized in that:

the infrared detection element is made of a first photodiode;

the temperature characteristic compensation element is made of a second photodiode; and the first photodiode and the second photodiode are formed of an identical material on an identical substrate and have an identical configuration so that the infrared ray enters in an identical manner.

13. The infrared sensor according to claim 1, characterized in that the correction unit comprises a temperature measuring element that measures a temperature of the light receiving unit.

14. The infrared sensor according to claim 13, characterized in that:

the correction unit comprises a plurality of the temperature measuring elements connected in series in a plurality of stages; and a temperature signal in which the temperature of the light receiving unit has been measured is extracted from an arbitrary connection point of the plurality of temperature measuring elements connected in series.

15. The infrared sensor according to claim 13, characterized in that:

the infrared detection element is made of a first photodiode;

the temperature measuring element is made of a third photodiode; and the first photodiode and the third photodiode are formed of an identical material on an identical substrate and have an identical configuration so that the infrared ray enters in an identical manner.

16. The infrared sensor according to claim 12 or claim 15, characterized in that the first photodiode is made of a compound including at least one of In and Sb.

17. The infrared sensor according to claim 12 or claim 15, characterized in that $InAs_xSb_{1-x}$ ($0 \leq x \leq 1$) is used for the light receiving surface of the first photodiode.

18. The infrared sensor according to claim 12 or claim 15 characterized in that the first photodiode comprises. a substrate; an n-type InSb layer formed on the substrate; a non-doped InSb layer formed on the n-type InSb layer; an AlInSb layer formed on the non-doped InSb layer; and a p-type InSb layer formed on the AlInSb layer.

19. The infrared sensor according to claim 13, characterized by comprising a correction computing unit that corrects the first output signal from the light receiving unit based on a temperature signal measured by the temperature measuring element.

20. The infrared sensor according to claim 19, characterized by comprising. a measurement unit that supplies a current to the temperature measuring element; and a reference voltage generating circuit that generates a reference voltage, wherein a first terminal of the light receiving unit is connected to the correction computing unit, a first terminal of the temperature measuring element is connected to the correction computing unit through the measurement unit, and a second terminal of the light receiving unit and a second terminal of the temperature measuring element are commonly connected to the reference voltage generating circuit.

21. The infrared sensor according to claim 20, characterized in that:
   at least a part of the light receiving unit and at least a part of the temperature measuring element share an element; and
   a control unit, which causes the light receiving unit and the temperature measuring element to alternately operate thereby causing the first output signal from the light receiving unit and the temperature signal from the temperature measuring element to alternately enter the correction computing unit, is included.

22. The infrared sensor according to claim 19, characterized in that the correction computing unit comprises:
   a storage unit that stores a correlation between output data from the light receiving unit and temperature data from the temperature measuring element, the output data and the temperature data occurring when the temperature of the surrounding atmosphere of the temperature measuring element is set up to a predetermined temperature and then the temperature of the object is changed;
   a computing unit that determines by computation a relational expression indicative of a relationship between the temperature of the object and the output from the light receiving unit, based on the correlation stored in the storage unit and the temperature data actually measured; and
   a calculation unit that calculates the temperature of the object by applying the output data actually measured to the determined relational expression.

23. The infrared sensor according to claim 19, characterized in that the correction computing unit comprises:
   a storage unit that stores output data from the light receiving unit and temperature data from the temperature measuring element, the output data and the temperature data occurring when the temperature of the object is set up to a predetermined temperature and then the temperature of the surrounding atmosphere of the temperature measuring element is changed;
   a computing unit that determines by computation a relational expression indicative of a relationship between the temperature of the object and the output of the light receiving unit, based on the correlation stored by the storage unit and the temperature data actually measured; and
   a calculation unit that calculates the temperature of the object by applying the output data actually measured to the determined relational expression.

24. The infrared sensor according to claim 1, characterized in that the correction unit comprises. a temperature characteristic compensation element that compensates a temperature characteristic of the first output signal from the light receiving unit; and a temperature measuring element that measures a temperature of the light receiving unit.

25. A thermometer characterized by comprising the infrared sensor according to claim 1 to measure the temperature of the object.

26. A body thermometer characterized by comprising the infrared sensor according to claim 1 to measure the temperature of a human body.

27. A human detection sensor characterized by comprising the infrared sensor according to claim 1 to detect a human body.

* * * * *